United States Patent [19]
Yoneya et al.

[11] Patent Number: 5,576,641
[45] Date of Patent: Nov. 19, 1996

[54] OUTPUT BUFFER

[75] Inventors: Kazuhide Yoneya, Kawasaki; Hiroyuki Koinuma, Yokohama, both of Japan

[73] Assignee: Kabushiki Kaisha Toshiba, Tokyo, Japan

[21] Appl. No.: 449,760

[22] Filed: May 25, 1995

[30] Foreign Application Priority Data

May 30, 1994 [JP] Japan .................... 6-117022

[51] Int. Cl.⁶ .................. H03K 19/0175; H03K 19/094
[52] U.S. Cl. ............................................ 326/83; 326/87
[58] Field of Search ........................................ 326/83, 87

[56] References Cited

U.S. PATENT DOCUMENTS

| | | | |
|---|---|---|---|
| 4,882,507 | 11/1989 | Tatsumi et al. | 326/83 |
| 4,908,528 | 3/1990 | Huang | 326/83 |
| 5,034,629 | 7/1991 | Kinugasa et al. | 326/83 |

Primary Examiner—Edward P. Westin
Assistant Examiner—Richard Roseen
Attorney, Agent, or Firm—Loeb & Loeb LLP

[57] ABSTRACT

An output buffer generates "1" or "0" data based on control signals VA and VB transferred from memory cells through a DQ gate in a DRAM. The output buffer has first and second discharge circuits, and a first output transistor (PMOS Transistor). The second discharge circuit stops discharging the gate of the first output transistor after the voltage on the gate drops below the threshold voltage of the first output transistor and the first output transistor turns ON. After this time, only the first discharge circuit discharges the gate of the first output transistor. Further, the output buffer has first and second precharge circuits, and a second output transistor (NMOS transistor). The second precharge circuit stops charging the gate of the second output transistor after the voltage on the gate increases above the threshold voltage of the second output transistor and the second output transistor turns ON. After this time, only the second discharge circuit continues charging the gate of the second output transistor.

25 Claims, 21 Drawing Sheets

SAD342

FIG.3D1

COLUMN DECODER 321

OUTPUT BUFFER

BACKGROUND OF THE INVENTION

1. Field of the Invention

The present invention relates to an output buffer for transferring data stored in memory cells within a memory array to external devices. An output buffer might be included in a semiconductor memory such as a Dynamic Random Access Memory (DRAM), a Static Random Access Memory (SRAM), a dual-port DRAM, and the like.

2. Description of the Prior Art

Output buffers for transferring data stored in memory cells in a semiconductor memory device to external devices typically comprise a CMOS circuit including P channel MOS (PMOS) transistors and N channel MOS (NMOS) transistors. FIG. 1 is a circuit diagram for a CMOS output buffer 10. Node I/O generates the output of the CMOS buffer in accordance with the conductance states of PMOS output transistor 13 and the NMOS output transistor 16. The CMOS output buffer can generate a high level data output ("1") when the PMOS output transistor 13 is ON and a low level data output ("0") when the NMOS output transistor 16 is ON.

PMOS output transistor 13 acts as the drive element for generating high level data "1" at output node I/O during the buffer's output mode of operation. The source of transistor 13 is connected to the power source potential Vcc and the drain of transistor 13 is connected to the output node I/O. The gate of output transistor 13 is connected to node V1 so that the potential at node V1 determines the conductance state of PMOS output transistor 13. For example, when the node V1 is precharged to a high level "1", transistor 13 is switched OFF, does not conduct, and the buffer cannot output a high level output signal. On the other hand, when a high level signal is to be output from the node I/O, the node V1 is discharged to a low level "0" so that the PMOS transistor 13 is ON and charges the node I/O to a high value "1". The potential at node V1 is determined by the conductance states of PMOS transistor 11 and NMOS transistor 12, which transistors are connected in series between a power source potential Vcc and a ground potential Vss. The source of the PMOS transistor 11 is connected to the power source potential Vcc and its drain is connected to the node V1. The source of the NMOS transistor 12 is connected to the ground potential Vss and the drain of the NMOS transistor 12 is connected to the node V1. A first control signal VA is supplied to the gates of both the PMOS transistor 11 and the NMOS transistor 12 to control the conductance states of transistors 11 and 12. For example, when the first control signal VA is held low, PMOS transistor 11 conducts and charges the node V1 to the high level "1", which places PMOS output transistor 13 in the non-output operation mode. When the first control signal VA is high, NMOS transistor 12 conducts, discharges V1 to a low level and places PMOS output transistor 13 in the output mode of operation. Thus, PMOS transistor 11 acts as a drive element for precharging node V1 to a high level "1+ and NMOS transistor 12 acts as a drive element for generating a low level "0".

NMOS output transistor 16 acts as a drive element for setting the node I/O to the low level "0" data during the output operation mode of the FIG. 1 buffer. The source of the NMOS output transistor 16 is connected to the ground potential Vss. The drain of the NMOS output transistor 16 is connected to the node I/O in common with the drain of the output transistor PMOS 13. Signals present at node V2 determine the potential present on the gate of the NMOS output transistor 16 and so control the transistor's conductance state. The potential on node V2 is determined by the conductance states of PMOS transistor 14 and NMOS transistor 15, which transistors are connected in series between the power source potential Vcc and the ground potential Vss. The source of the PMOS transistor 14 is connected to the power source potential Vcc and the drain of the PMOS transistor 14 is connected to the node V2. The source of the NMOS transistor 15 is connected to the ground potential Vss and the drain of the NMOS transistor 15 is connected to the node V2. The PMOS transistor 14 acts as a drive element for setting node V2 to the high level during the buffer's output operation mode and NMOS transistor 15 acts as a drive element for precharging the node V2 to the low level during the non-output operation mode. The second control signal VB, which is at the high level "1" during the buffer's non-output operation mode, is supplied to the gates of both the PMOS transistor 14 and the NMOS transistor 15.

The operation of the output buffer 10 having the configuration described above will now be explained. In the non-output operation mode of the buffer, a low "0" first control signal VA is supplied to the gates of both the PMOS transistor 11 and the NMOS transistor 12 so that a low level signal is supplied to the gate of the output PMOS transistor 13, placing PMOS transistor 13 in the OFF state. A high "1" value of the second control signal VB is supplied to the gates of PMOS transistor 14 and NMOS transistor 15, causing a low value of the signal V2 to be present on the gate of the NMOS output transistor 16 so that the output transistor 16 is OFF. Since output transistors PMOS 13 and NMOS 16 are both in the OFF state, the output node I/O is in a high impedance state where the output node I/O does not provide output data. The output node I/O provides neither "1" data nor "0" output data so long as the first control signal VA is low "0" and the second control signal VB is high "1".

The buffer 10 is switched to the output operation mode by switching either one of the first and second control signals VA and VB. Specifically, the buffer switches to a state where it outputs a high level "1" at output node I/O when the second control signal VB is held at the high level "1" and the control signal VA is switched from the low level "0" to the high level "1". The buffer 10 outputs low level data "0" at the I/O node when the first control signal VA is held at the low level "0" and the second control signal VB switches from the high level "1" to the low level "0".

For the buffer's high level data "1" output operation, a high level "1" signal VB is supplied to the gates of both the PMOS transistor 14 and the NMOS transistor 15 in the same manner as in the non-output operation mode, so that a low level "0" V2 is supplied to the gate of NMOS output transistor 16 and the output transistor 16 remains in the OFF state. Because the gate voltage potential VA of PMOS transistor 11 and NMOS transistor 12 is changed from the low level "0" to the high level "1", the supply of the power potential Vcc to the node V1 is switched off, and the electric potential of the node V1 switches from the high level "1" to the low level "0" as current flows from node V1 to the ground potential Vss. As a result, the low level "0" is supplied to the gate of the output transistor PMOS 13, the power supply potential Vcc is provided to the output node I/O, and the output node I/O outputs high level data "1".

When the buffer outputs low level data "0", a low level signal "0" VA is provided to the gates of PMOS transistor 11 and NMOS transistor 12 in the same manner as during the non-output operation mode, so that the high level "1" V1 is supplied to the output transistor PMOS 13, which remains in the OFF state. Signal VB switched from the high level "1" to the low level "0", switching the conductance states of PMOS transistor 14 and NMOS transistor 15. Consequently, the current path from the node V2 to the ground potential Vss is cut, and the node V2 charges from the low level "0" to the high level "1" as the power source potential Vcc is supplied to the node V2. As a result, the high level "1" is supplied to the gate of the output transistor NMOS 16, a current path is formed from the output node I/O to the ground potential Vss, and the electric potential of the output node I/O is changed to the low level "0".

The conventional output buffer 10 comprising CMOS circuits having the configuration shown in FIG. 1 can display certain undesirable characteristics. With increasing bit densities in products such as memory devices, the problems with output noise produced by buffers such as those illustrated in FIG. 1 have increased. The magnitude of the output noise is largely dependent on the magnitude of the time rate of change of the current flow in the output transistor, specifically, the size of the derivative dI/dt. Attempts to reduce the output noise signal by simply reducing the size of the derivative dI/dt can, however, unacceptably slow the switching speed of the output buffer.

FIG. 2 illustrates a semiconductor device formed on a chip which includes an output buffer 10 as shown in FIG. 1. In FIG. 2, PMOS transistor 19 acts as an output transistor for driving output node I/O with high level data "1", and NMOS transistor 22 acts as an output transistor for driving output node I/O with low level data "0". Capacitor "C0" represents an internal capacitance connected between an internal power supply Vcc-chip of the chip and an internal ground potential level Vss-chip of the chip. Reference characters L1 and L2 denote internal inductances that exist along the along the wiring lines that couple terminals 17 and 18 to the rest of the chip. Because the external power supply Vcc is provided to terminals 17 and 18, inductances L1 and L2 act to prevent Vcc-chip and Vss-chip from corresponding to Vcc and Vss-external, when one or the other of the voltages or grounds is subject to variations. A reference character C1 represents an output load capacitance between an I/O pad 21, connected to output node I/O of the chip, and an external ground potential Vss-ext.

In an output operation for the FIG. 2 circuit, a voltage dI/dt is produced when either of the output transistors PMOS 19 or NMOS 22 is switched to an ON state. For example, when low level data "0" is output at node I/O, the output transistor NMOS 22 switches ON and a voltage dI/dt is produced. Because the current flowing through NMOS 22 changes, a voltage dI/dt is produced across the inductor L2 which is connected between the external ground potential Vss and the internal ground potential Vss-chip. The potential difference V3=dI/dt across the inductor L2 causes the internal ground potential Vss-chip to rise in comparison with the external ground potential Vss-ext. Clock signal levels for the chip vary with variations in the external ground potential Vss-ext by an amount equal to the swing (noise) of the internal power of the chip, i.e., the voltage V3=dI/dt that appears across inductor L2. It is possible that the clock signals can vary to such an extent that the clock signals are not correctly recognized within the chip. Accordingly, the swing in the internal power of the chip should be kept small, and for this reason the dI/dt which flows in the output transistors of the output buffer during switching should also be kept small.

Conventionally, dI/dt is kept small in the buffer circuit of FIG. 1 by minimizing the width W of the NMOS transistor 12 when the output buffer generates high level data "1", and by minimizing the width W of the PMOS transistor 14 when the output buffer generates the low level data "0". The effect of reducing the width of the NMOS transistor 12 and the PMOS transistor 14 is to reduce the rate of change dV/dt of the voltages V1 and V2 applied to the gates of the output transistors 13 and 16, respectively. When dV/dt is small for V1 and V2, the rate of change dI/dt of the current flowing through the output transistor (13 or 16) being switched ON is maintained small. However, when dV/dt of V1 or V2 is maintained small, the current flowing through node V1 or the node V2 is also small. Thus, the time required until the output transistor switches ON and the buffer outputs a signal becomes large. This is undesirable because it reduces the switching speed of the buffer.

To reduce the rate of change dI/dt of the current flowing at the output node I/O and, consequently, the magnitude of the output noise, it is necessary to limit the change of the gate potential of the output transistor (i.e., either dV1/dt or dV2/dt) during the portion of the switching transition when the output transistor is ON. In other words, dV1/dt or dV2/dt must be limited only for the portion of the switching transition during which the gate voltage V1 or V2 for the respective output transistor 13 or 16 is greater than the threshold voltage for that output transistor. Regardless of this, to reduce the output noise for the conventional output buffer circuit shown in FIG. 1, the rate of change of the gate voltage potential V1 or V2 is kept small during switching in the time period where the output transistor 13 or 16 is not yet ON. The amount of time required until the output transistor 13 or 16 comes ON increases in accordance with the amount that the rate of change of the gate voltage of the output transistor decreases. Consequently, the output noise of a conventional buffer circuit cannot be reduced without undesirably increasing the memory access time.

SUMMARY OF THE INVENTION

Accordingly, an object of the present invention is, with due consideration to the drawbacks of the conventional output buffer (or a conventional data out buffer) used in semiconductor integrated circuits such as a Dynamic Random Access Memory (DRAM), a Static Random Access Memory (SRAM), a dual-port DRAM and the like, to provide an output buffer (or a data out buffer) for use in semiconductor integrated circuits wherein the switching time until an output transistor in the output buffer comes ON is reduced, so that access time of the output buffer is improved.

A further object of the present invention is to provide an output buffer (or data out buffer) for use in semiconductor integrated circuits wherein output noise of the output buffer can be reduced. A still further object of the present invention is to provide an output buffer of a semiconductor integrated circuit wherein the switching time until an output transistor comes ON is not increased while at the same time output noise is reduced.

In accordance with one aspect of the present invention, an output buffer has an input terminal and an output terminal. The input terminal receives a control signal and the output terminal outputs high level data in response to the control signal. The output buffer includes a precharge circuit for charging the control node to a voltage potential, the precharge circuit comprising a first PMOS transistor connected between a power source and a control node, a gate of the first PMOS transistor being connected to the input terminal. Two discharge circuits are preferably provided: A first discharge circuit, connected between the control node and a ground source; and a second discharge circuit, connected between the input terminal and the control node, each discharge circuit for discharging the voltage potential of the control node. An output transistor for the buffer comprises a second PMOS transistor connected between the high power source and the output terminal, where a gate of the second PMOS transistor is connected to the control node. This second PMOS transistor generating the high level data at the output terminal in response to the voltage potential of the control node. In this buffer, the precharge circuit stops charging the control node in response to the first control signal, and the first discharge circuit and the second discharge circuit begin discharging the control node in response to the first control signal. Additionally, the second discharge circuit stops discharging the control node when the voltage potential of the control node becomes equal to or less than a threshold voltage potential of the second PMOS transistor.

In accordance with a further aspect of this embodiment, the buffer may include circuitry for detecting the voltage potential on the gate of the second PMOS transistor.

In accordance with another aspect of the present invention, an output buffer An output buffer has an input terminal and an output terminal, with the input terminal receiving a control signal and the output terminal outputting low level data in response to the control signal. The buffer includes a discharge circuit comprising a first NMOS transistor connected between a ground source and a control node, where a gate of the first NMOS transistor is connected to the input terminal, and the discharge circuit discharges a voltage potential of the control node to a voltage potential of the ground power source. The buffer includes a first precharge circuit connected between the control node and a power source and a second precharge circuit connected between the input terminal and the control node, both the first and the second precharge circuits for charging the control node. A second NMOS output transistor is connected between the ground source and the output terminal, a gate of the second NMOS transistor being connected to the control node, the second NMOS transistor generating the low level data in response to the voltage potential of the control node. In this buffer, the discharge circuit stops discharging the control node in response to the control signal, the first precharge circuit and the second precharge circuit begin charging the control node based in response to the control signal, and the second precharge circuit stops charging the control node when the voltage potential of the control node is equal to or less than a threshold voltage potential of the second NMOS transistor.

In accordance with another aspect of the present invention, an output buffer has first and second input terminals and an output terminal, the first input terminal receiving a first control signal, the second input terminal receiving a second control signal, the output terminal providing high level data in response to the first control signal, and the output terminal providing low level data in response to the second control signal. The output buffer includes a first PMOS transistor for charging a first control node, where the first PMOS transistor is connected to a high power source and to the first control node, and where a gate of the first PMOS transistor is connected to the first input terminal. A first discharge circuit discharges the first control node includes a first NMOS transistor connected between the first control node and a ground source, where a gate of the first NMOS transistor being connected to the gate of the first PMOS transistor. A second discharge circuit also discharges the voltage potential of the first control node, and comprises: a second NMOS transistor and a third NMOS transistor connected in series between the first control node and the ground source, and a first inverter connected between the first input terminal and the gate of the third NMOS transistor, a gate of the second NMOS transistor being connected to the first input terminal. A second PMOS transistor generates high level data in response to a voltage potential of the first control node, the second PMOS transistor being connected between the high power source and the output terminal, and a gate of the second PMOS transistor being connected to the first control node.

In this embodiment, a fourth NMOS transistor discharges a second control node, where the fourth NMOS transistor is connected between the ground source and the second control node, and where a gate of the fourth NMOS transistor is connected to the second input terminal. A first precharge circuit for charging the voltage potential of the second control node comprises a third PMOS transistor connected between the second control node and the power source, a gate of the third PMOS transistor being connected to the gate of the fourth NMOS transistor. A second discharge circuit for discharging the voltage potential of the second control node, comprises a fourth PMOS transistor and a fifth PMOS transistor connected in series between the second control node and the power source and a second inverter connected between the second input terminal and the gate of the fourth PMOS transistor, a gate of the fifth NMOS transistor being connected to the second input terminal. A fifth NMOS transistor generates the low level data in response to a voltage potential of the second control node, where the first NMOS transistor is connected between the ground power source and the output terminal, and where a gate of the fifth NMOS transistor is connected to the second control node. In this buffer circuit, the first PMOS transistor stops charging the first control node in response to the first control signal, the first NMOS transistor and the second and third NMOS transistors begin discharging the first control node in response to the first control signal, the second and third NMOS transistors stop discharging the first control node when the voltage potential of the first control and is equal to or less than a threshold voltage potential of the second PMOS transistor, and the fourth NMOS transistor stops discharging the second control node in response to the second control signal, the third PMOS transistor and the fourth and fifth PMOS transistors begin charging the second control node in response to the second control signal, the fourth and fifth PMOS transistors stop charging the second control node when the voltage potential of the second control node is equal to or less than a threshold voltage potential of the fifth NMOS transistor. A threshold voltage of the first inverter is equal to the threshold voltage of the second PMOS transistor and a threshold voltage of the second inverter is equal to the threshold voltage of the second NMOS transistor.

An output buffer in accordance with still another aspect of the present invention has a first input terminal and an output terminal, the first input terminal receiving a first control signal, the output terminal providing high level data in response to the first control signal. This output buffer comprises a booster connected to the first input terminal for receiving the first control signal and generating a boosted voltage greater than a voltage potential of a high power source. A first PMOS transistor is provided for charging a control node, where the first PMOS transistor is connected between the booster and the control node, and where a gate of the first PMOS transistor is connected to the first input terminal. A first NMOS transistor is connected between the control node and a ground source, where a gate of the first NMOS transistor is connected to the first input terminal. A second NMOS transistor provides the high level data to the output terminal, where the second NMOS transistor is connected between the high power source and the output terminal, and where a gate of the second NMOS transistor is connected to the control node. Second and third PMOS transistors are connected in series between the booster and the control node, where a gate of the third PMOS transistor is connected to the first input terminal. An inverter is connected between the first input terminal and a gate of the second PMOS transistor, wherein a threshold voltage of the inverter is equal to the threshold voltage of the second NMOS transistor.

In accordance with a further aspect of this embodiment, the buffer includes a second input terminal, the second input terminal receiving an inverted first control signal and the output terminal provides low level data in response to the second control signal. A third NMOS transistor is connected to the output terminal and the ground source, and the gate of the third NMOS transistor is connected to the second input terminal, so that the third NMOS transistor provides the low level data to the output terminal.

According to another aspect of the present invention, an output buffer having an input terminal and an output terminal comprises a precharge circuit connected to a power source, to a control node and to the input terminal. The precharge circuit charges the control node to a voltage potential in response to a first value of a control signal. The buffer includes a first and second discharge circuit for discharging the voltage potential of the control node. A PMOS output transistor is connected to the high power source and to the output terminal, a gate of the output transistor is connected to the control node, and the PMOS output transistor generates high level data at the output terminal in response to the voltage potential of the control node. For this buffer, the precharge circuit stops charging the control node in response to a second value of the control signal, and the first discharge circuit and the second discharge circuit begin discharging the control node in response to the second value of the control signal. The second discharge circuit stops discharging the control node when the voltage potential of the control node becomes equal to or less than a threshold voltage potential of the PMOS output transistor.

In accordance with another aspect of the present invention, an output buffer has an input terminal and an output terminal, the input terminal receives a control signal and the output terminal outputs low level data in response to the control signal. A discharge circuit connected to a ground source and a control node discharges the control node to a voltage potential of the ground power source. The buffer includes a first and a second precharge circuit for charging the control node. An NMOS output transistor connected between the ground source and the output terminal has its gate connected to the control node so that the NMOS output transistor generates the low level data in response to the voltage potential of the control node. In this buffer, the discharge circuit stops discharging the control node in response to the control signal and the first precharge circuit and the second precharge circuit begin charging the control node in response to the control signal. The second precharge circuit stops charging the control node when the voltage potential of the control node is equal to or less than a threshold voltage potential of the NMOS output transistor.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent through the following description of preferred embodiments which are given for illustration of the invention and are not intended to be limiting thereof.

Figure 3A:
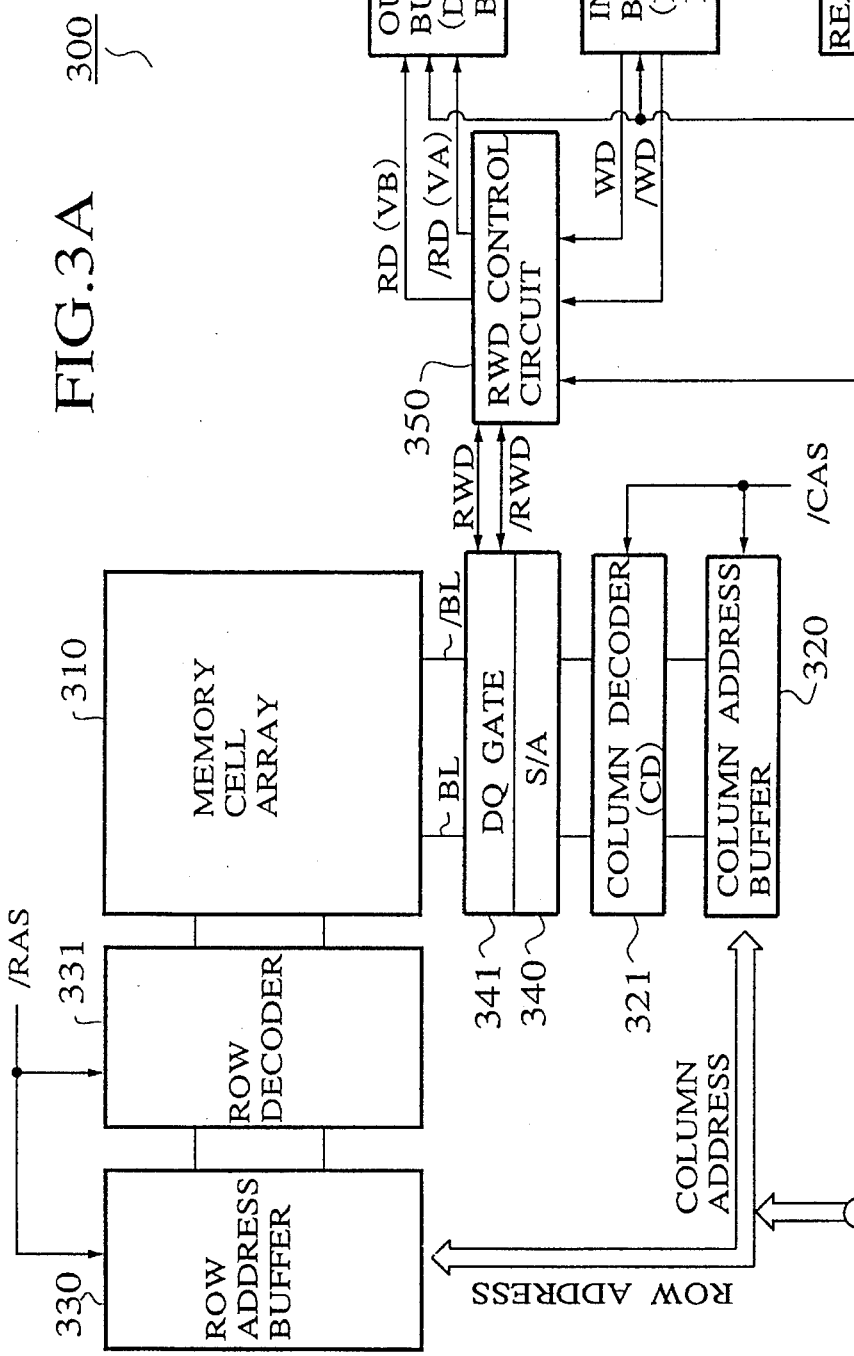
FIG. 3A schematically illustrates a Dynamic Random Access Memory (DRAM) incorporating an output buffer (or a data out buffer) according to the present invention.

Preferred embodiments of an output buffer according to the present invention will now be described with reference to the drawings. FIG. 3A shows a Dynamic Random Access Memory (DRAM) 300 having an output buffer 370 (or a data out buffer) according to the present invention. In the following exemplary embodiments, the output buffer of the present invention is incorporated in the DRAM shown in FIG. 3A, but the output buffer of the present invention can be used in other types of integrated circuit devices such as a Static Random Access Memory (SRAM), a dual-port DRAM, and the like.

As shown in FIG. 3A, the DRAM 300 has a memory cell array 310 including a plurality of memory cells, a column address buffer 320 to latch a column address, a column decoder (CD) 321 to decode a column address from the column address buffer 320, a row address buffer 330 to latch a row address, a row decoder 331 to decode a row address from the row address buffer 330, a sense amplifier (S/A) array 340, and a DQ gate 341, a read/write data (RWD) control circuit 350, an input buffer 360 (or a data in buffer), a data out buffer 370 and a read/write control circuit 380.

The memory cell array 310 stores data within the DRAM 300. The output buffer 370 generates high level data "1" and low level data "0" corresponding to the data stored in the memory cells in the memory cell array 310. The read/write control circuit 380 receives various control signals for read/write operations such as a row address strobe /RAS, a column address strobe /CAS, a write enable /WE, an output enable /OE, etc., and the read/write control circuit 380 controls memory operations on the basis of these signals. When the potential of the row address strobe /RAS is at the low level, a row address is latched into the row address buffer 330. When the potential of the column address strobe /CAS is at the low level, a column address is latched into the column address buffer 320. When the potential of the write enable /WE is at the low level, data are written into memory cells in the memory cell array 310 and when the output enable /OE is low, data are read out of the memory cell array 310.

During a data read out operation, memory cells in the memory cell array 310 are addressed by the row address and the column address latched into the respective row and column buffers, and data are read out from the memory cells within array 310 to bit lines BL and /BL. The data on the bit lines BL and /BL are sensed by the sense amplifier (S/A) array 340, whose operation is controlled by a sense amplifier driver (SAD) shown in FIG. 3C. During a read operation, the DQ gate 341 causes the data amplified by the sense amplifiers S/A to be transferred to the read write data lines RWD and /RWD. The data on the read write data lines RWD and /RWD are then transferred to the read data lines RD and /RD and to the output buffers 370.

When data are not present on the data lines, the data lines are maintained at equal potentials. For example, the voltage potentials of the lines RWD, /RWD and RD, /RD are all kept at the high level during an inactive state when memory cells are not being addressed. In the active state, data read out from the memory cells appear as complementary logic signals on the data lines. If high level data "1" are read out from the memory cell array, the potentials of the read write data line RWD and the read data line RD are charged to the high level while the read write data line /RWD and the read data line /RD are at the low level. On the other hand, if low level data "0" are read out from the memory cell array, the potentials of the read write data line /RWD and the read data line /RD are at the high level, and the potentials of the read write data line RWD and the read data line RD are at the low level. In the data read out operation of the low level data "0", the potential of the read data line RD is equal to that of the second control signal VB. On the other hand, when high level data "1" are read out from the memory cells, the inverted potential level of the read data line /RD is equal to the first control signal VA because the first control signal VA is changed from the low level to the high level in the following embodiments.

The RWD control circuit 350 controls the transfer of data from the read write data lines RWD and /RWD to the read data lines RD, /RE and to the write data lines WD, /WD. The input buffer 360 is connected to the RWD control circuit 350 through the write data lines WD and /WD. The output buffer 370 is connected to the RWD control circuit 350 through the read data lines RD and /RD. Data out buffer 370 transfers data to an external device (not shown) through the I/O port.

Figure 3B:
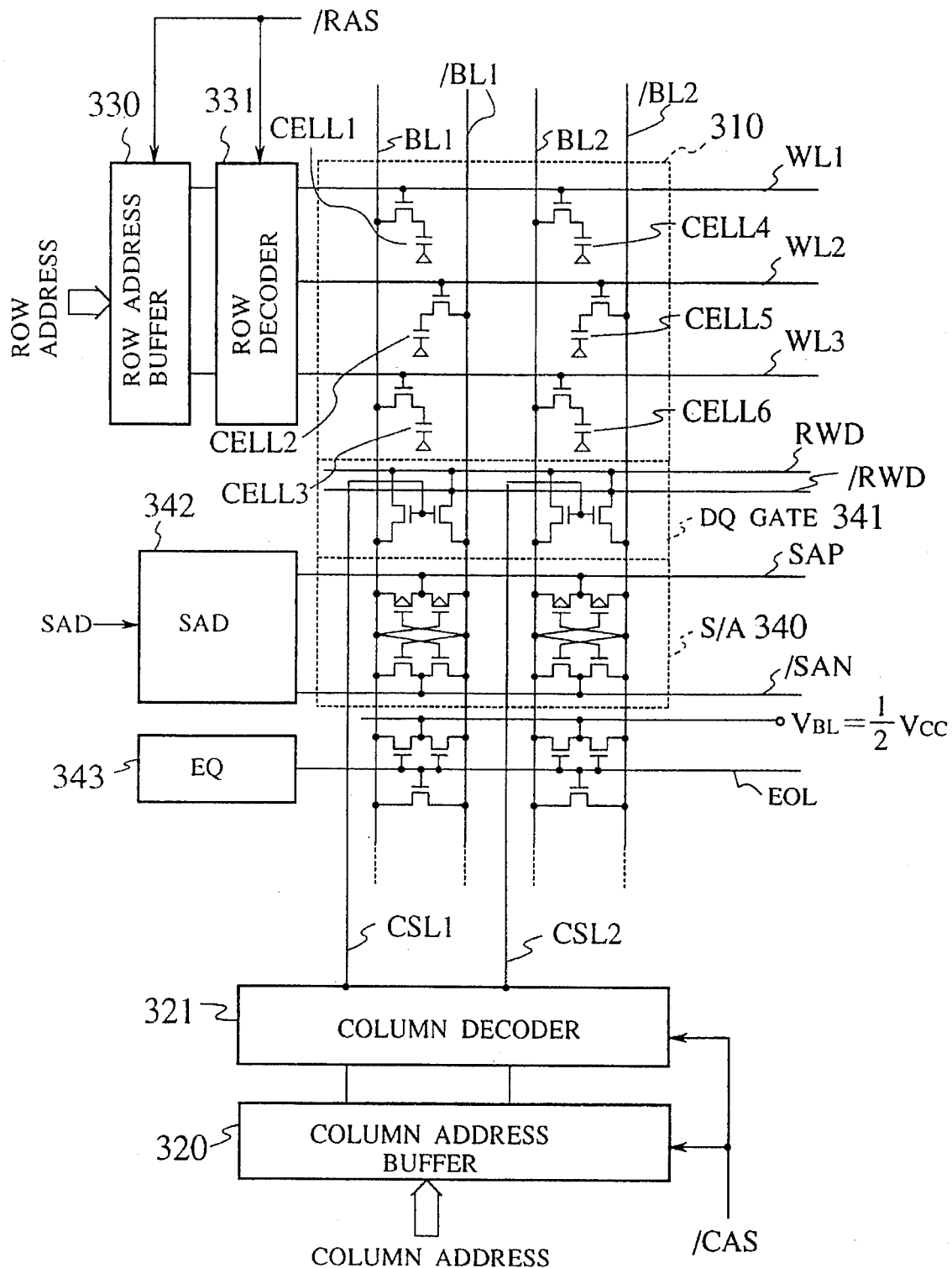
FIG. 3B provides a more detailed view of a portion of the DRAM of FIG. 3A.

FIG. 3B is a more detailed configuration diagram showing the memory cells CELL1, CELL2 . . . CELL6 that make up the memory cell array 310 of the DRAM shown in FIG. 3A. In a data read out operation, memory cells CELL1 and CELL2 connected to a word line WL1 are selected by the row decoder 331. Bit lines BL1, /BL1, BL2, and /BL2 are equalized by the equalizer EQ 343. The data in the memory cells CELL1 and CELL2 selected by the row decoder 331 are then transferred to bit lines BL1 and /BL1 that have been selected by the signals provided to column select line CSL1 by the column decoder 321. Data on bit lines BL1 and /BL1 are sensed by the sense amplifier 340 under control of the sense amplifier driver (SAD) 342 shown in FIG. 3C, and then the data on the bit lines BL1 and /BL1 are transferred to read write data lines RWD and /RWD. Data read out of the memory cells and to the lines RWD and /RWD are transferred to external devices (not shown) through the output buffer 370.

As shown in FIG. 3B, the sense amplifier (S/A) 340 includes two pairs P channel MOS transistors, with each PMOS pair connected in series between one pair of bit lines BL1, /BL1 and BL2, /BL2. Sense amplifier 340 also includes two pairs of N channel MOS transistors, with each NMOS pair connected in series between one pair of bit lines BL1, /BL1 and BL2, /BL2. An intermediate point at the connection between the two PMOS transistors that make up each pair is connected to a control signal SAP line. Similarly, an intermediate point at the connection between the two NMOS transistors that make each NMOS pair is connected to a control signal /SAN line. The gate of one of the PMOS transistors and an adjacent one of the NMOS transistors is connected to the BL1 line. The other PMOS transistor of that pair and the adjacent NMOS transistor each has its gate connected to the bit line /BL1 and /BL2. The gates of the individual PMOS and NMOS transistors of the other pairs of PMOS and NMOS transistors are respectively coupled to bit lines BL2 and /BL2.

Figure 3C:
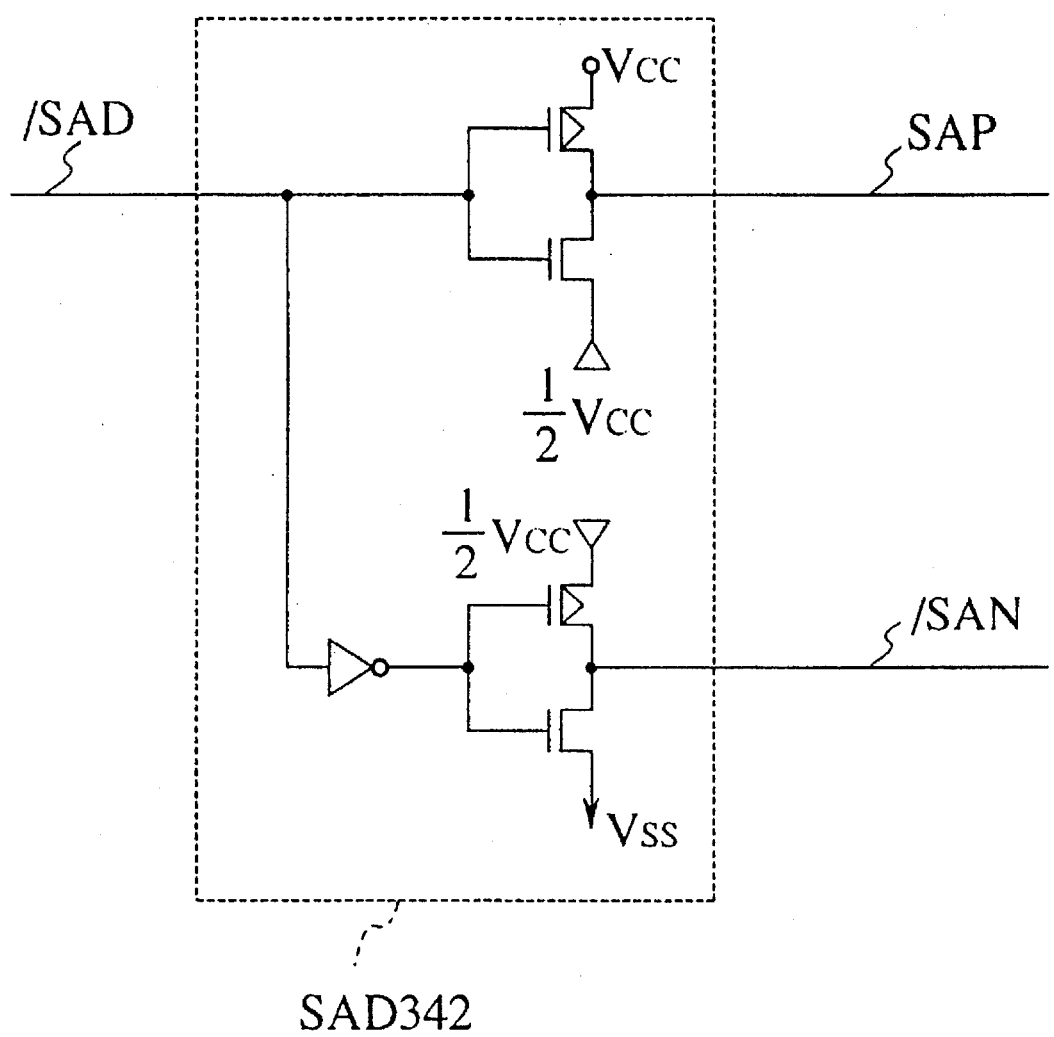
FIG. 3C provides a more detailed view of a portion of the circuitry of FIG. 3B.

FIG. 3C provides a more detailed illustration of the sense amplifier driver (SAD) 342 which controls the sense amplifier (S/A) 340 shown in FIG. 3A and FIG. 3B. The operation of the sense amplifier driver 342, along with the sense amplifier 340, is conventional.

Figure 3D:
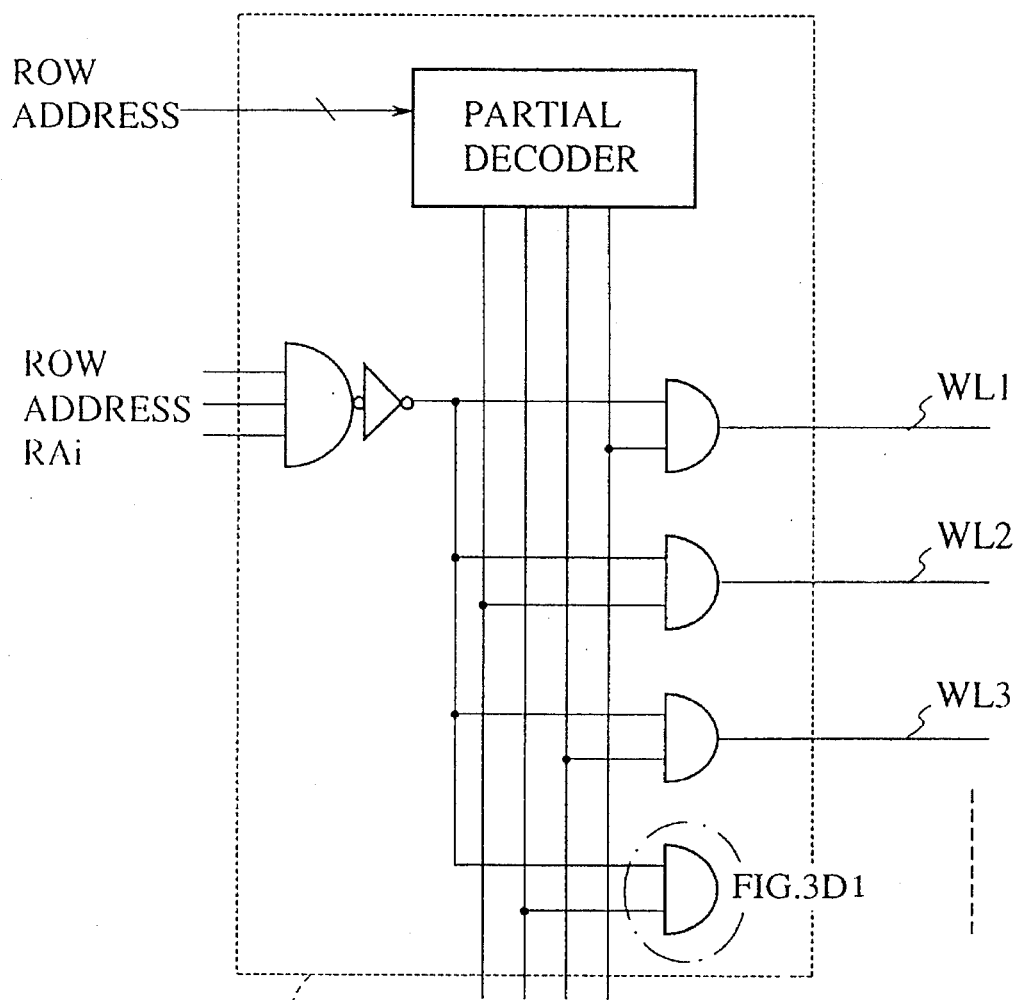
FIG. 3D provides a more detailed view of a portion of the circuitry of FIG. 3B.
Figure 3D:
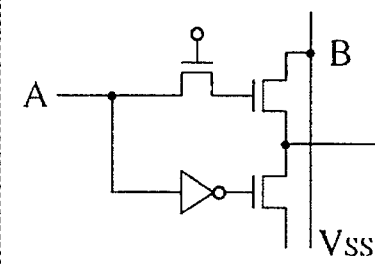
Figure 3E:
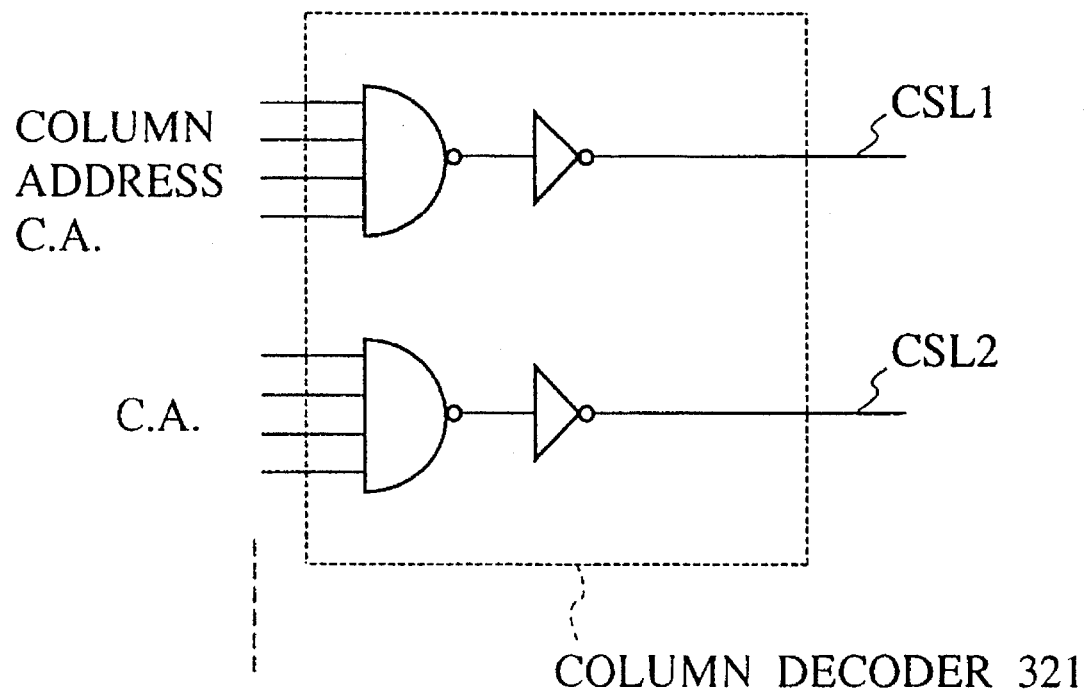
FIG. 3E provides a more detailed view of a portion of the circuitry of FIG. 3B.

FIG. 3D illustrates the row decoder 331 incorporated in the DRAM. Row address data (RAi) from the row address buffer 330 are received by the row decoder 331 in order to select one of the word lines WL1, WL2, WL3, . . . FIG. 3E is a circuit configuration diagram of the column decoder 321. Column address data (C.A.) from the column address buffer 320 are received by the column decoder 321 in order to select one of the column selection lines CSL1 and CSL2.

Figure 4:
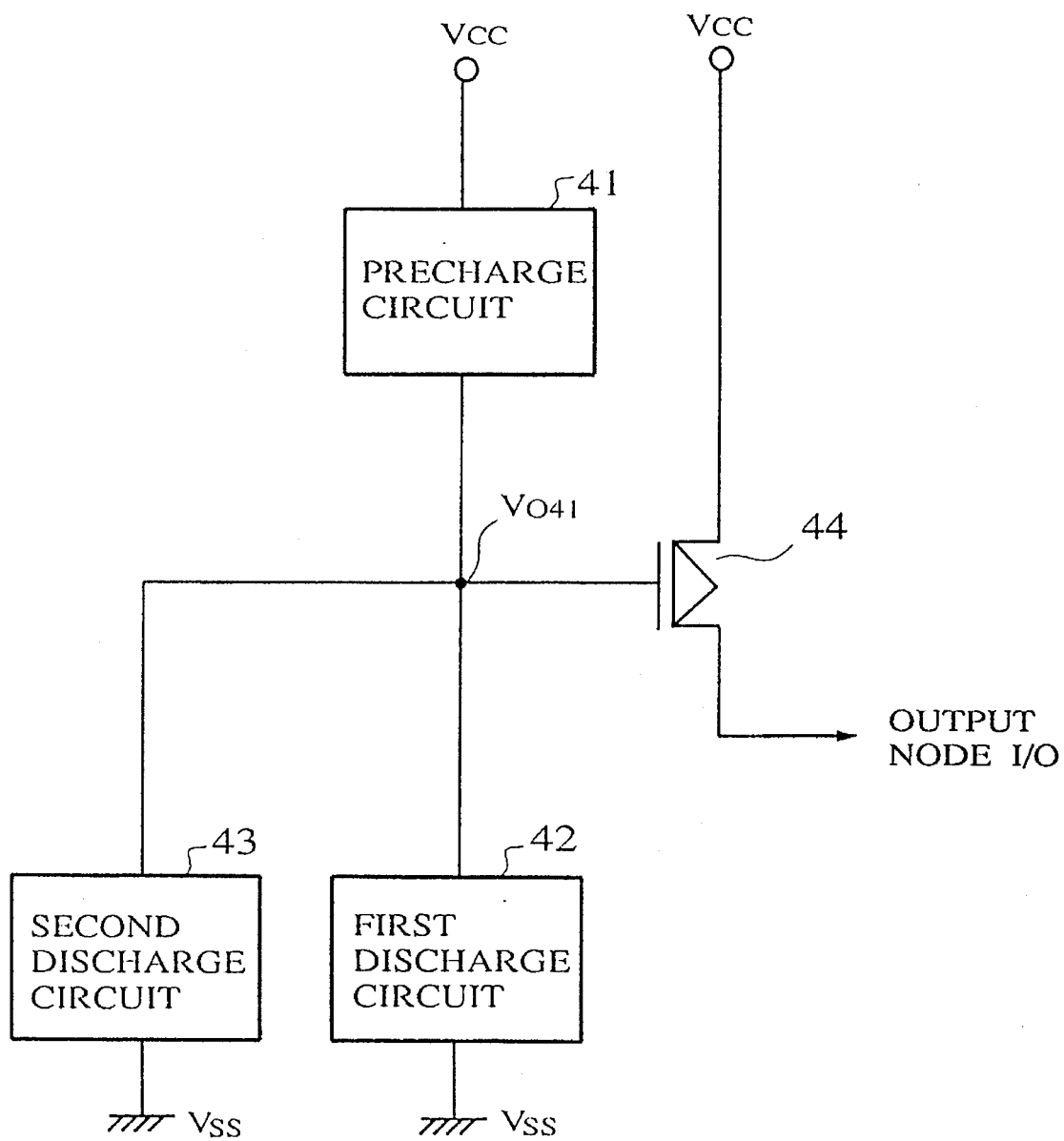
FIG. 4 schematically illustrates an output buffer according to the present invention incorporated in the semiconductor memory device shown in FIG. 3A.

Preferred embodiments and implementations of the output buffer 370 according to the present invention will now be explained with reference to the drawings. FIG. 4 schematically illustrates an output buffer 40 that, in accordance with the present invention, may be incorporated in a semiconductor memory device such as that shown in FIG. 3A. The output buffer of FIG. 4 generates a high level data "1" output signal at node I/O.

As shown in FIG. 4, the output buffer comprises a precharge circuit 41, a first discharge circuit 42, a second discharge circuit 43 and a PMOS output transistor 44. The precharge circuit 41 is connected between a power source potential Vcc and a control node Vo41. First and second discharge circuits 42 and 43 are connected in parallel between the node Vo41 and a ground source potential Vss. PMOS output transistor 44 acts as a drive element during an output operation for generating high level data "1" at output node I/O. The source of output transistor 44 is connected to the power potential Vcc and the transistor's drain is connected to the output node I/O. The gate of the PMOS output transistor 44 is connected to the node Vo41.

In a non-output operation mode, a high level potential is maintained at node Vo41 to keep PMOS output transistor 44 in an OFF state. When data are output from the FIG. 4 buffer, the PMOS output transistor 44 is switched to an ON state by discharging the potential at node Vo41 to a low level. Both the first discharge circuit 42 and the second discharge circuit 43 begin discharging the node Vo41 in common when the buffer is initially switched to an output operation mode. When the potential of the node Vo41 has dropped to a specific level (on the order of the threshold voltage of the PMOS output transistor), the discharge operation of the second discharge circuit is halted. In this way, the buffer illustrated in FIG. 4 discharges the potential at node Vo41 at an initial higher rate during the initial portion of a switching operation. After the potential on the node Vo41 discharges to a predetermined level, then the second discharge circuit 43 is switched off so that the potential on the node Vo41 is discharged at a second, lower rate.

Figure 5:
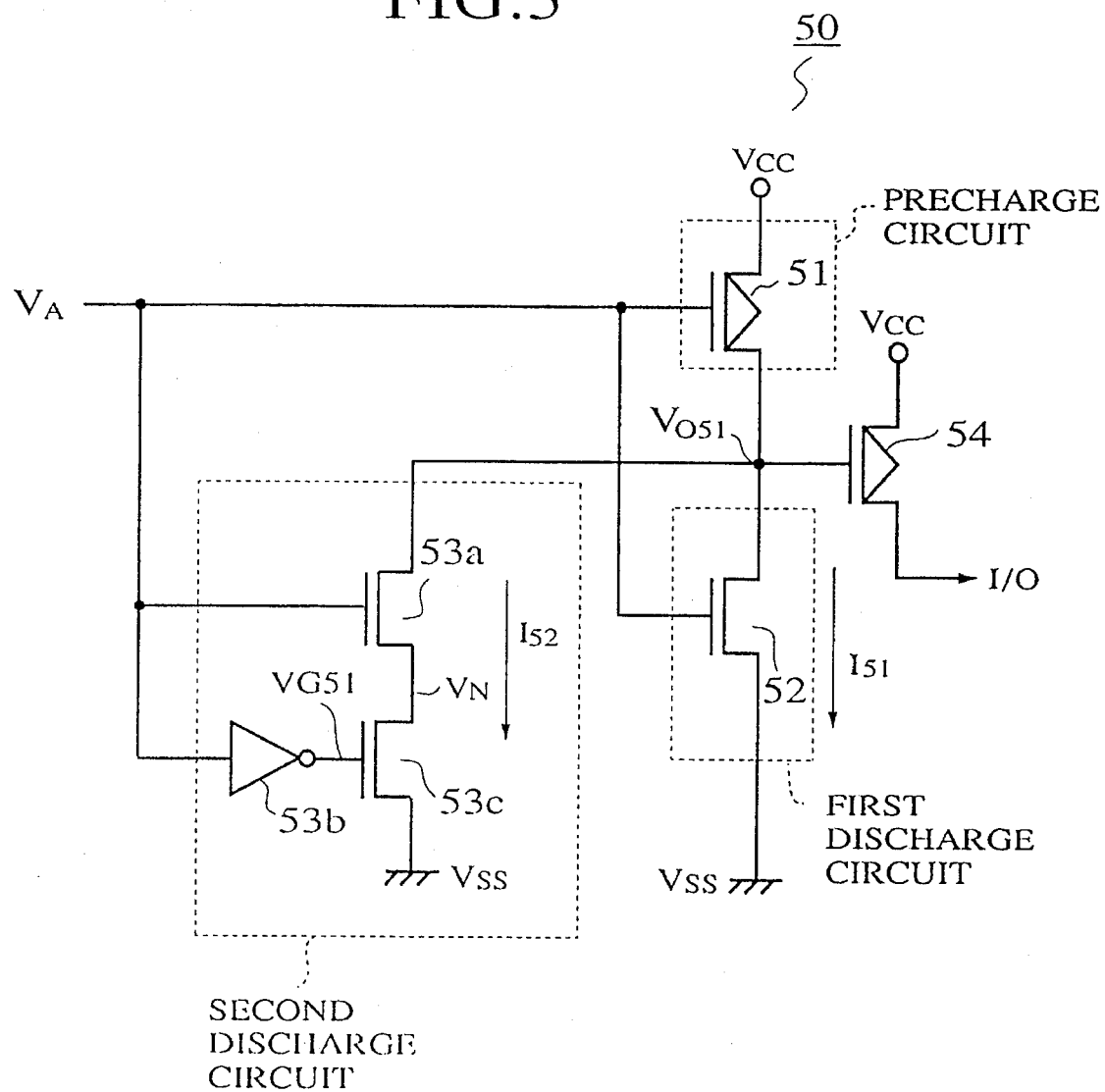
FIG. 5 is a circuit diagram showing a more detailed illustration of the output buffer shown in FIG. 4 for generating a high level data "1".

FIG. 5 shows an output buffer 50 which is one embodiment of the output buffer 40 shown in FIG. 4. During the data read out operation of the high level data "1" in the embodiments of FIGS. 5, 7 and 8, the inverted potential level of the read data line /RD (shown in FIG. 3A) is equal to that of the first control signal VA. In FIG. 5, PMOS transistor 51 (a precharge circuit) maintains the node Vo51 at the high level in the non-output operation mode. The source of the PMOS transistor 51 is connected to the power source potential Vcc and the drain of the PMOS transistor 51 is connected to the node Vo51. NMOS transistor 52 is a drive element for discharging the node Vo51 to the low level during an output operation mode. The source of the NMOS transistor 52 is connected to the ground potential Vss and the drain of the NMOS transistor 52 is connected to the node Vo51. In the FIG. 5 buffer, NMOS transistor 52 is a first discharge circuit. The second discharge circuit comprises an NMOS transistor 53a, a logic gate (inverter) 53b, and an NMOS transistor 53c. The NMOS transistor 53a is a drive element for discharging the node Vo51 to the low level during an output operation mode. The source of the NMOS transistor 53a is connected to a node VN and the drain of the NMOS transistor 53a is connected to the node Vo51. The inverter 53b performs an inversion operation so that an inverted value of signal VA is supplied to the gate of the NMOS transistor 53c. The source of the NMOS transistor 53c is connected to the ground potential Vss while the drain of the NMOS transistor 53c is connected to the node VN. Accordingly, NMOS transistor 53c maintains the node VN at the ground potential level Vss during the non-output operation mode. The first control signal VA, which is at the high level "1" for the output operation mode and at the low level for the non-output operation mode, is supplied in common to the gates of each of the PMOS transistor 51, the NMOS transistor 52 and the NMOS transistor 53a, and to the input gate of the inverter 53c.

Figure 6:
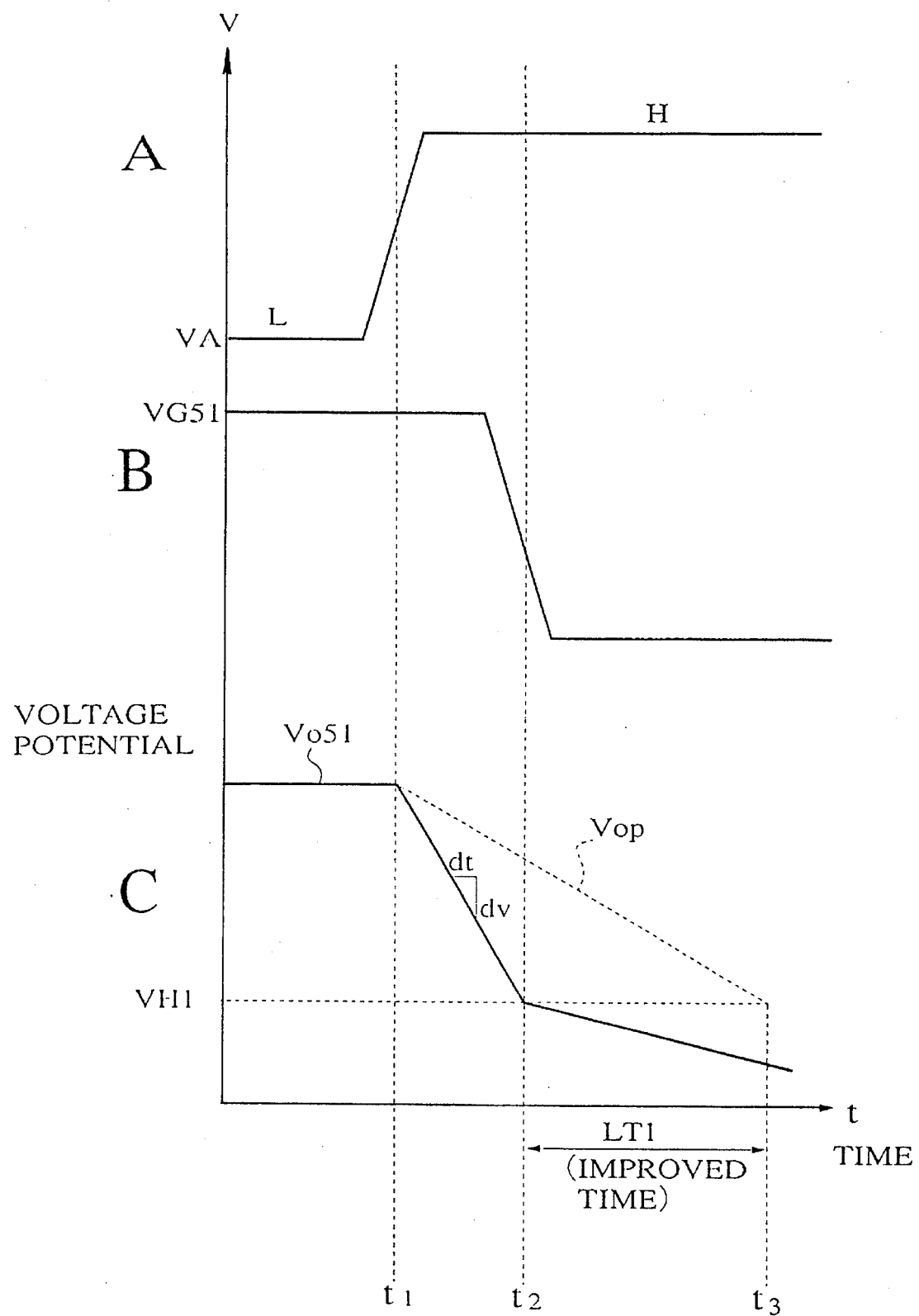
FIG. 6 is a timing chart showing the operation of the output buffer shown in FIG. 5.

Next, the operation of the FIG. 5 embodiment will be explained using a timing chart as illustrated in FIG. 6. During the non-output operation mode prior to a time t1, the NMOS transistor 53a and the NMOS transistor 52 are OFF, and only the PMOS transistor 51 is ON because the low level "0" of the first control signal VA is provided to the gates of each of these transistors. This results in the high level being applied to the gate of PMOS output transistor 54 so that the output transistor 54 remains OFF. Output node I/O thus does not output the high level and buffer is in a high impedance state. Also during this time, the low level of the first control signal VA is applied to the input terminal of the inverter 53b so that the output node VG51 of the inverter 53b is at the high level and the NMOS transistor 53c is ON. As a result, the potential of the node VN is at the low level.

In the transition to the output operation mode, the first control signal VA is changed from the low level "0" to the high level "1". After the time t1 has elapsed and the first control signal VA is at the high level "1", the power source potential Vcc supplied to the node Vo51 is cut off as the PMOS transistor 51 switches off. The charge initially present on the node Vo51 drains to the ground potential Vss following one or the other of two paths I51 and I52, because a high level signal "1" is supplied to the gates of both NMOS transistor 52 and NMOS transistor 53a to keep both of these transistors initially in the ON state. However, the current path I52 through the NMOS transistor 53a is cut off after an initial time period (time t1 to t2) as the output node VG51 of the inverter 53b changes from the high level "1" to the low level "0" and switches the NMOS transistor 53c OFF.

The potential on the gate of PMOS transistor 54 changes from the high level "1" to the low level "0" as current flows from the node Vo51 to the ground potential Vss. As the potential on the gate of the output transistor 54 changes to the low level "0", the output transistor 54 comes ON and Vcc is supplied to the output node I/O so that the output transistor 54 generates the high level data "1". In preferred embodiments of the FIG. 5 buffer circuit, the inverter 53b switches OFF during the discharge of node Vo51 through current paths I51 and I52. Most preferably, the output of inverter 53b switches from the high level "1" to the low level "0" at the time t2 when the potential of the node Vo51 (which is the gate potential of the NMOS transistor 53a) is equal to the threshold voltage VH1 of the output transistor 54. This may conveniently be accomplished if the inverter 53b is a CMOS circuit having a NMOS discharge transistor (not shown) designed to have similar switching characteristics to the NMOS transistor 52 within the first discharge circuit. Consequently, the transistor NMOS 53c switches OFF when the potential of the node Vo51 is equal to the threshold voltage of the output transistor 54 so that the further discharge of node Vo51 (and thus the switching ON of PMOS transistor 54) continues at a slower rate. In this case, the discharge of node Vo51 that occurs while the output transistor 54 is ON (after time t2) occurs only through the current path I51.

As outlined above, when the output buffer 50 of the FIG. 5 embodiment generates the high level data "1", the potential of the node Vo51 is rapidly changed from the high level to the low level through the current paths I51 and I52 during a time period from t1 to t2 (shown in FIG. 6), which may be about 1 ns, until the output transistor 54 switches ON. After the output transistor 54 is ON (i.e., after the time t2 shown in FIG. 6), the potential of the node Vo51 is changed more slowly by discharging only through one current path I51. Because the rate at which the node voltage Vo51 changes (dV/dt) is kept small only during the time period when the output transistor 54 is ON, the delay until the output transistor 54 switches ON can be optimized while still obtaining improved output noise performance from the FIG. 5 buffer.

Figure 1:
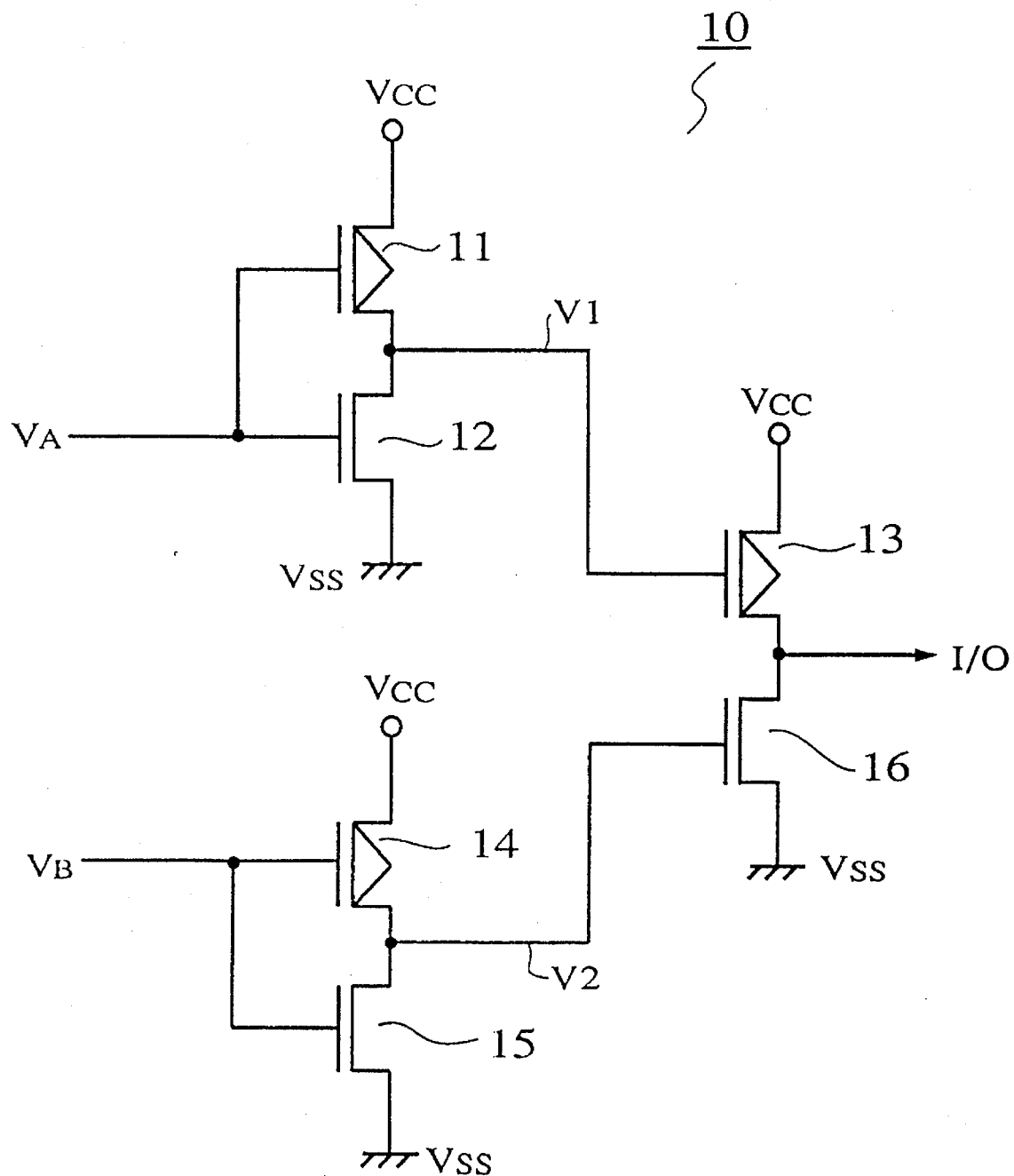
FIG. 1 is a circuit diagram of a conventional output buffer used in a semiconductor memory circuit.
Figure 2:
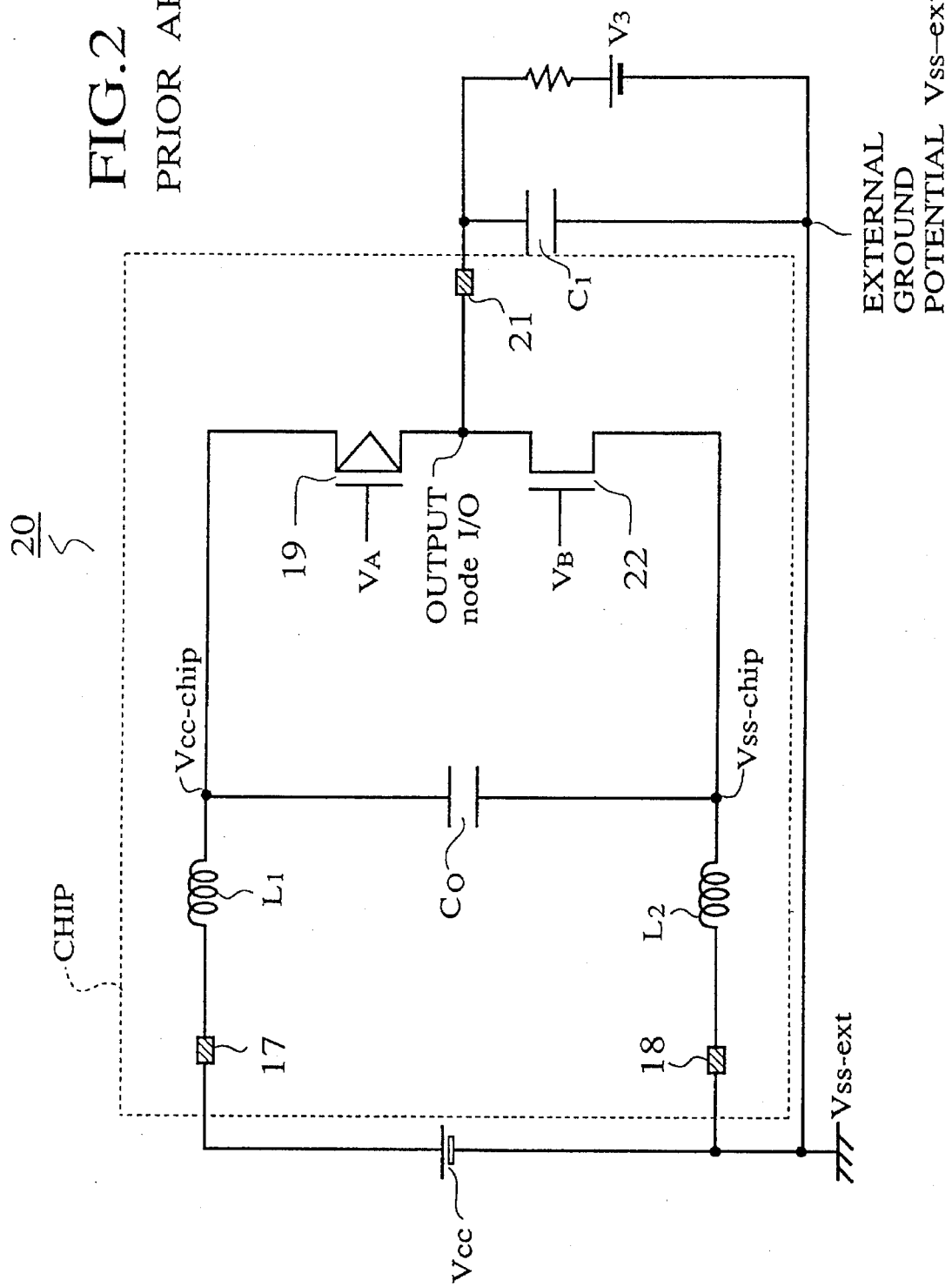
FIG. 2 is an equivalent circuit of the conventional output buffer shown in FIG. 1.

By comparison, in the conventional buffer circuit such as that shown in FIG. 1, the rate of change of the potential at the gate of the output transistor is kept small even when the output transistor is not yet ON. Thus, the potential at the gate of the PMOS output transistor in the conventional buffer has a discharge characteristic like that shown as the dotted line Vop in FIG. 6. The time t3 at which the potential of the gate of the PMOS output transistor reaches the threshold voltage VH1 of the output transistor in the conventional buffer is delayed by a time period LT1 (for example, about 2 ns) with respect to the time t2 at which the node Vo51 reaches the threshold voltage VH1 in the FIG. 5 buffer. In the FIG. 5 embodiment, the level of voltage fluctuations (i.e., noise signals) associated with rapid changes in the current flowing through the output transistor can be reduced without incurring the portion (LT1, shown in FIG. 6) of the time delay associated with the constant reduced level gate discharge current used in conventional noise reduction techniques with conventional buffers. When the FIG. 5 buffer is included in a memory device such as that shown in FIG. 3A, the swing (voltage fluctuations) in the internal source power of the chip (output noise) can be maintained small.

Figure 7:
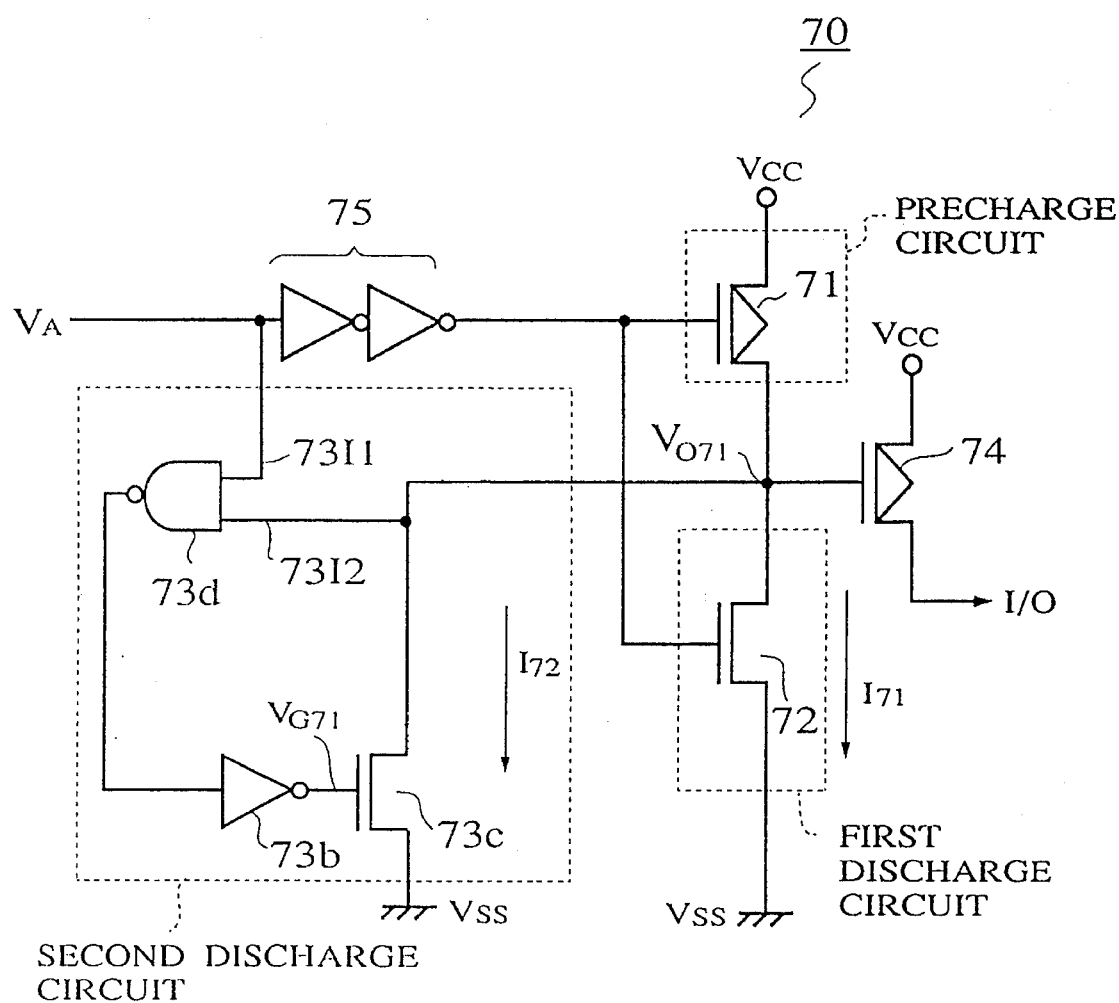
FIG. 7 is a circuit diagram showing another more detailed diagram of the output buffer shown in FIG. 4.

FIG. 7 is a circuit diagram of an output buffer 70 in accordance with another aspect of the present invention. Like the embodiment illustrated in FIG. 5, the buffer 70 illustrated in FIG. 7 can be substituted for the output buffer 370 shown in FIG. 3A. The output circuit 50 shown in FIG. 5 differs from the output circuit 70 shown in FIG. 7 in the following ways. The NMOS transistor 53a of the output buffer 50 is not included in the output circuit 70 and a NAND gate 73d is incorporated in the output buffer 70. The NAND gate 73d receives as inputs the first control signal VA (at input 73I1) and the potential of the node Vo71 (at input 73I2). The output of the NAND gate 73d is provided to the gate of NMOS transistor 73c (which corresponds to the NMOS transistor 53c shown in FIG. 5) through the inverter 73b. Further, the first control signal VA is transmitted to the gate of the PMOS transistor 71 (precharge circuit) and the gate of the NMOS transistor 72 (first discharge circuit) through a two stage inverter 75.

The output buffer 70 shown in FIG. 7 operates in the following manner. During the non-output operation mode, the NMOS transistor 72 is OFF and the PMOS transistor 71 is ON because the low level of the first control signal VA is supplied to the gates of the PMOS transistor 71 and the NMOS transistor 72. Accordingly, the potential of the node Vo71 is at the high level "1", and this high level "1" is supplied to the gate of the PMOS output transistor 74 so that the output transistor 74 remains OFF. Also at this time, the potential of the node VG71 is at the low level and the NMOS transistor 73c is OFF because the first control signal VA of the low level is supplied to the first input node 73I1 of the NAND gate 73d. Accordingly, the high level data "1" is not provided at the output node I/O of the buffer 70 and the node I/O is in a high impedance state.

When the potential of the first control signal VA switches from the low level "0" to the high level "1" to switch to the output operation mode, the high level VA signal is provided at first input node 73I1 of the NAND gate 73b. At this time, the output side of the inverter 75 remains at the low level "0" for a period of time due to the delay of the inverter 75, so that the node Vo71 connected to the second input node 73I2 of the NAND gate 73d remains at the high level "1" for the same period of time. For this period of time, the first and second input nodes 73I1 and 73I2 of the NAND gate 73d are both at the high level "1" and the output of the NAND gate 73d is at the low level "0". Consequently, the output node VG71 of the inverter 73b is at the high level "1" and the NMOS transistor 73c switches ON. The output side of the inverter 75 then switches to the high level "1", PMOS transistor 71 (precharge circuit) switches OFF and the supply of the power source potential Vcc through the PMOS transistor 71 to the node Vo71 is cut off. In addition, because the high level "1" is supplied to the gate of the NMOS transistor 72 and to the gate of NMOS transistor 73c, the current paths I71 and I72 connected from the node Vo71 to the ground potential Vss both carry current discharging the node Vo71 during the initial time period.

When the potential of the node Vo71 discharges to the low level "0" and becomes smaller than the threshold voltage of the NAND gate 73d, the output from the NAND gate 73d reverts to the high level "1", the output VG71 of the inverter 73b changes to the low level "0" and the NMOS transistor 73c switches OFF. Current flows along the path I72 through the NMOS transistor 73c only during the time period extending from when the potential of the node VG71 switches from the low level "0" to the high level "1" until the NMOS transistor 73c is turned OFF. From this time on, the potential at node Vo71 discharges only through NMOS transistor 72. When the node Vo71 discharges to the low level "0", PMOS output transistor 74 switches ON, the power source potential Vcc is supplied to the output node I/O and the output buffer 70 generates the high level data "1".

In the output buffer 50 shown in FIG. 5, the time at which second discharge circuit is switched OFF is set to be equal to the time at which the potential of the node Vo51 reaches the threshold voltage VH1 of the output transistor 54 by manipulation of the design. Accordingly, in the FIG. 5 embodiment, there is concern that an error could be produced either with regard to establishing this set point or where the characteristics of the circuit elements vary with temperature changes and the like. In contrast to the buffer 50 of FIG. 5, the output buffer 70 shown in FIG. 7 directly detects the potential of the node Vo71 (specifically, connected to the gate of the output transistor 74). Therefore the time at which the node VG71 of the inverter 73b is changed to the low level "0" can be set more precisely. For example, the switching of NAND gate 73d (and thus transistor 73c) directly depends on the voltage at node Vo71, so that the temperature variations and variations in the system operating voltage do not alter the desired timing of the switching operation. Accordingly, the delay until the output transistor 74 is switched ON can be more accurately optimized.

Figure 8:
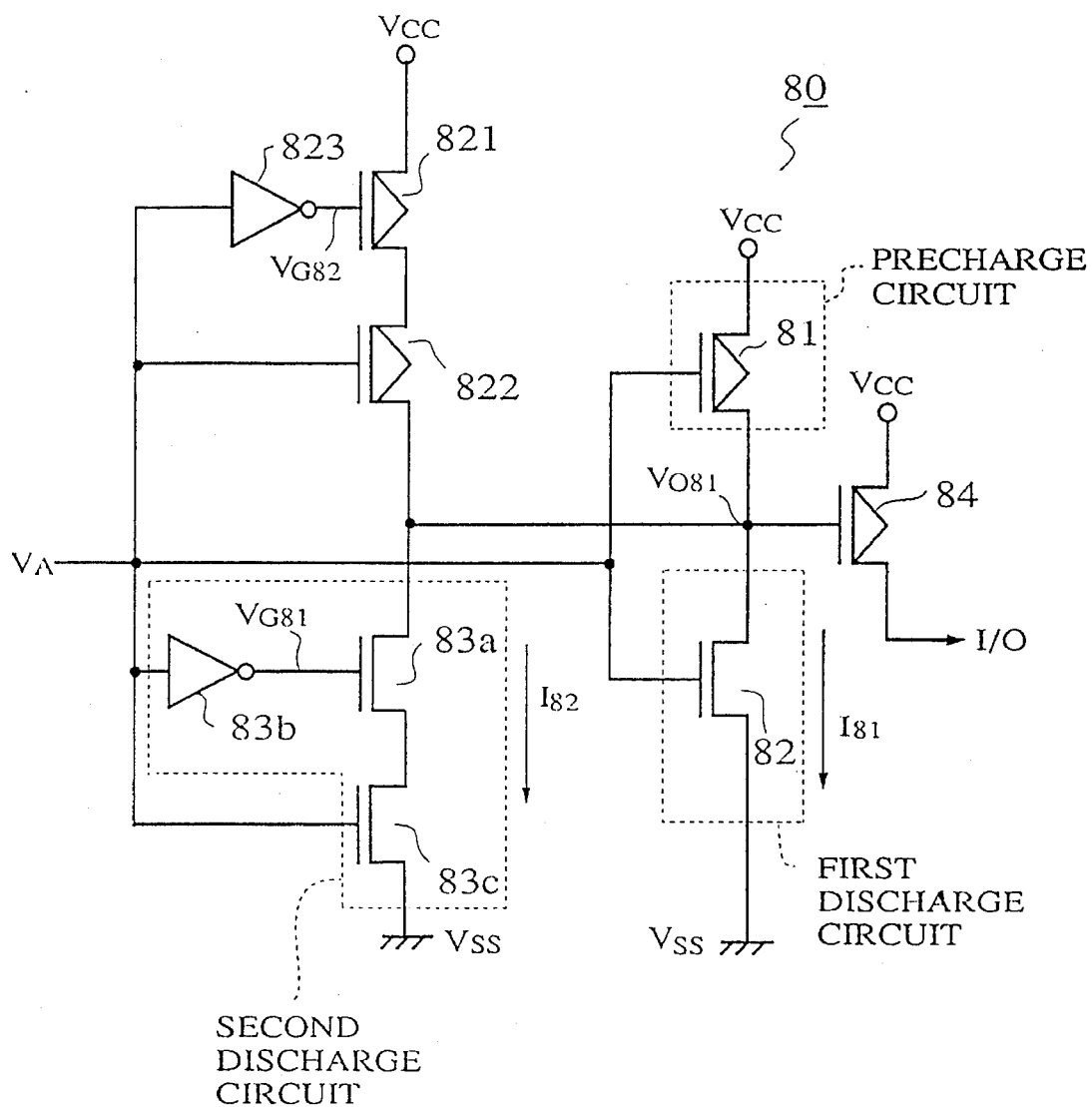
FIG. 8 is a circuit diagram showing another more detailed diagram of the output buffer shown in FIG. 4.

FIG. 8 is a circuit diagram of an output buffer 80 of another embodiment according to the present invention. The output buffer 80 of the FIG. 8 embodiment differs from the output buffer 50 shown in FIG. 5 as follows: The inverter 83b (corresponding to inverter 53b of FIG. 5) in the output buffer 80 is connected to the gate side of the NMOS transistor 83a (rather than to NMOS transistor 53c, as in the FIG. 5 buffer). In addition to this, a pair of PMOS transistors 821, 822 is connected in series between the node Vo81 (which corresponds to the node Vo51 of the FIG. 5 buffer)

and the power potential Vcc. An inverted value of the first control signal VA is supplied to the gate of the PMOS transistor 821 through an inverter 823 and the first control signal VA is supplied directly to the gate of the PMOS transistor 822. In the output buffer 50 shown in FIG. 5, the discharge operation of the second discharge circuit including the MOS transistors 53a and 53c is halted by turning the NMOS transistor 53c OFF, but with the output buffer 80 of the embodiment shown in FIG. 8, the discharge operation is halted by turning the NMOS transistor 83a OFF. The output buffer 80 exhibits the same type of operating results as does the output buffer 50 shown in FIG. 5 with respect to discharging the potential at the node Vo81.

On the other hand, how the node Vo81 is charged in the FIG. 8 embodiment further differs from how the node Vo51 of the FIG. 5 embodiment is charged. In the FIG. 8 embodiment, when the potential of the first control signal VA is changed from the high level "1" to the low level "0" and the output operation mode is switched to the non-output operation mode, the current path I81 to the ground potential Vss through the NMOS transistor 82 is cut, and the PMOS transistor 81 and the PMOS transistor 822 are turned ON because the low level is supplied to the gates of each of the PMOS transistor 81 and the PMOS transistor 822. For a period of time (i.e., for one delay of inverter 823) following the first control signal VA switching from the high level "1" to the low level "0", the potential of the output node VG82 connected to the output side of the inverter 823 remains at the low level. As a result, the power potential Vcc is initially supplied to the node Vo81 through two current paths, one current path through PMOS transistor 81 and the other current path through PMOS transistors 821 and 822. However, the current path through PMOS transistors 821 and 822 is temporary, because the low level "0" of the signal VA causes the inverter 823 to output a high level signal "1" after an inverter delay period. If the inverter 823 is, for example, a CMOS circuit, then the delay time of inverter 823 is determined by how long it takes for sufficient charge to flow through a PMOS transistor to charge the node VG82. The delay time of the inverter 823 may thus be chosen so that the inverter 823 is on as long as necessary for the node Vo81 to charge sufficiently to turn off the PMOS transistor 84. After the inverter 823 switches, the potential on the node VG82 changes from the low level to the high level and turns OFF the PMOS transistor 821. Thus, the two PMOS transistors 821 and 823 are both ON only for a limited period of time.

Because of the operation of the FIG. 8 buffer described above, the NMOS transistor 82 is quickly turned OFF while the generation of output noise is restrained during the switching OFF transition. It is therefore possible for the output node I/O to quickly return to the high impedance state. Such an operation is therefore desirable for multibit memory products in which many floating nodes are used.

Figure 9:
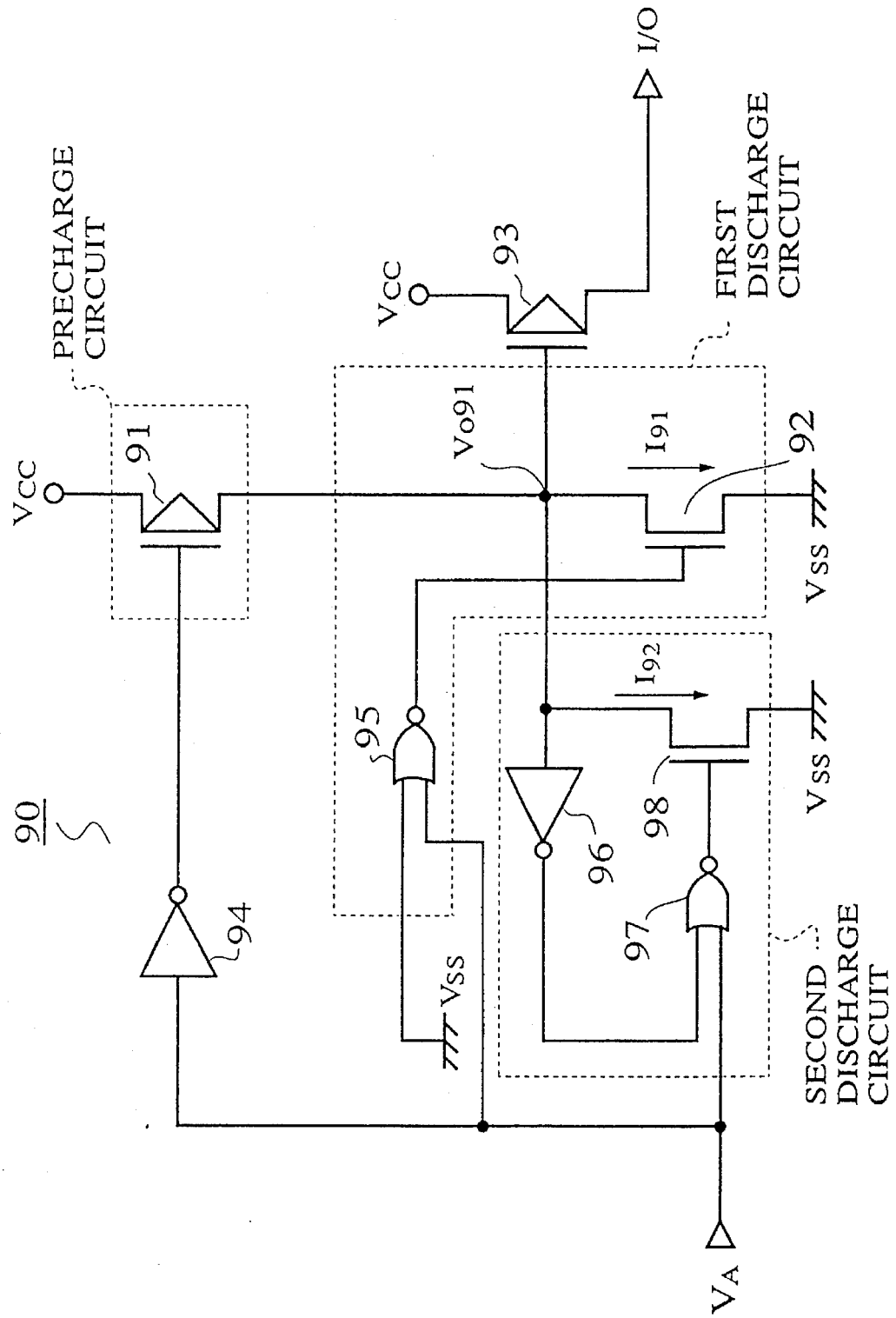
FIG. 9 is a circuit diagram showing another more detailed diagram of the output buffer shown in FIG. 4.
Figure 10:
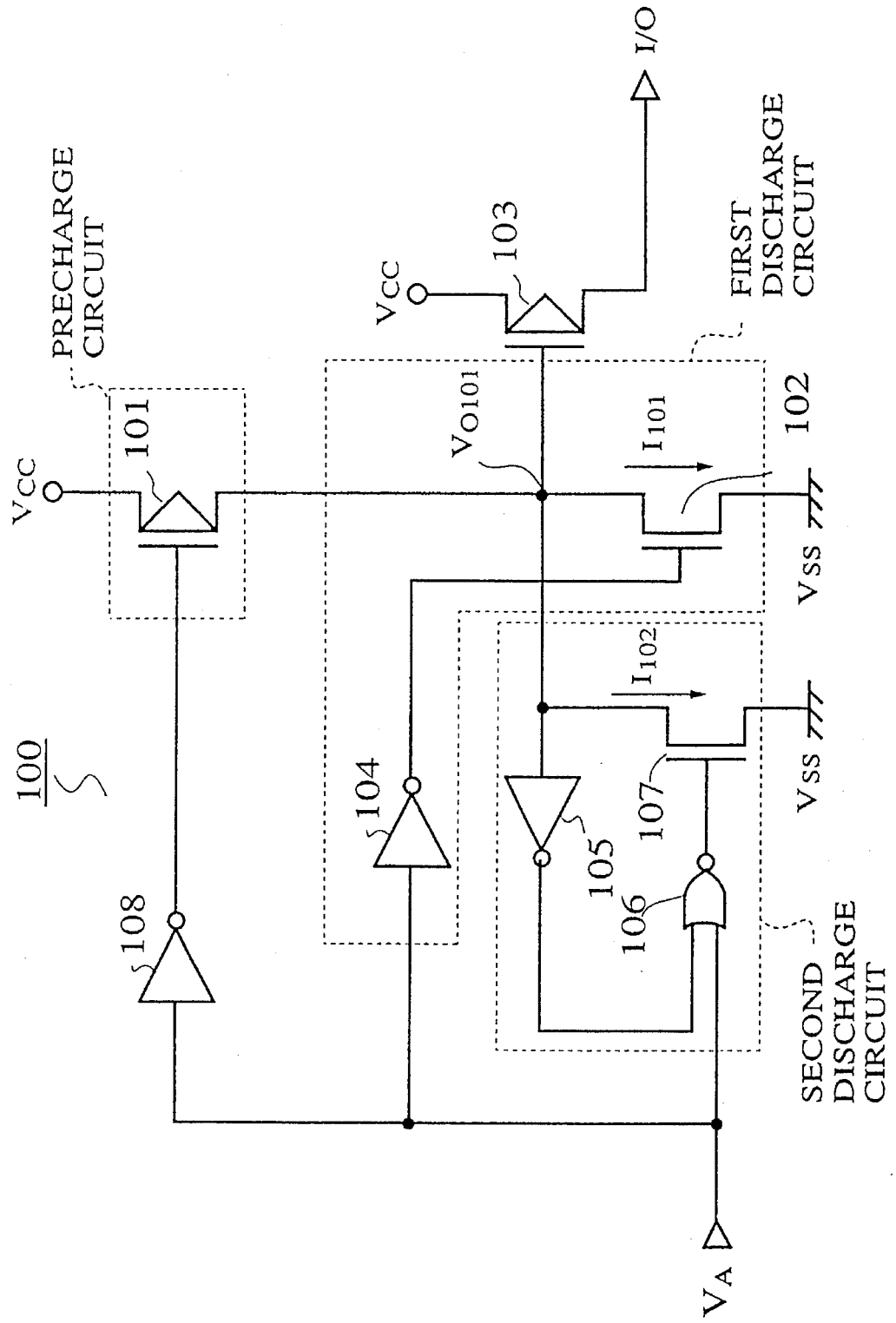
FIG. 10 is a circuit diagram showing another more detailed diagram of the output buffer shown in FIG. 4.
Figure 11:
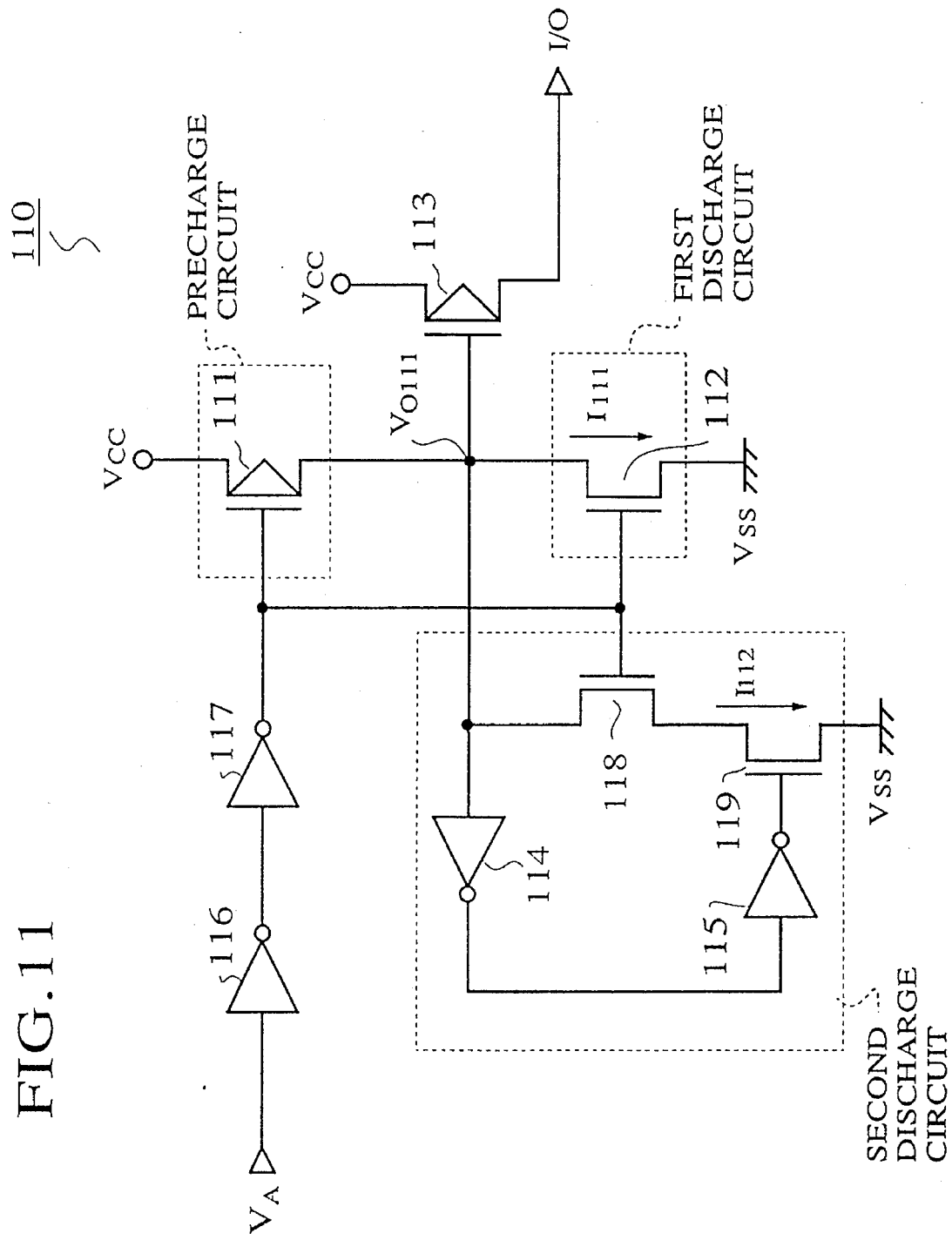
FIG. 11 is a circuit diagram showing another more detailed diagram of the output buffer shown in FIG. 4.

Other embodiments of the output buffer of the present invention are shown in FIGS. 9, 10, and 11. FIG. 9 is a circuit diagram of an output buffer which might be used within the output buffer 370 of the memory device illustrated in FIG. 3A. For the embodiment of FIG. 9, during the data read out operation of the high level data "1", the potential level of the read data line /RD shown in FIG. 3A is equal to a first control signal VA. The output buffer 90 has a precharge circuit, a first discharge circuit, a second discharge circuit, an inverter 94 and a PMOS output transistor 93. Node Vo91 is connected to a gate of the PMOS output transistor 93. Output transistor 93 is connected between the power source Vcc and an output node I/O. The precharge circuit comprises a PMOS transistor 91 which is connected between a power source Vcc and a node Vo91. The gate of the PMOS transistor 91 receives the first control signal VA as inverted by the inverter 94. The first discharge circuit comprises NMOS transistor 92 which is connected between the node Vo91 and a ground potential Vss. The first discharge circuit further includes a first NOR gate 95. The first control signal VA is supplied to one of inputs of the first NOR gate 95 and the other input of the NOR gate 95 is connected to the ground potential Vss. The output of the first NOR gate 95 is connected to the gate of the NMOS transistor 92. The second discharge circuit comprises a second inverter 96, a second NOR gate 97 and an NMOS transistor 98. The first control signal VA is supplied also to the second NOR gate 97. The node Vo91 is connected to the second inverter 96 and the output of the second inverter 96 is supplied to the other input of the second NOR gate 97. The output of the second NOR gate 97 is supplied to the gate of the NMOS transistor 98.

When the first control signal VA is at the high level, buffer circuit 90 is placed in a non-output operation mode. The output of the NOR gate 97 is at the low level so that NMOS transistor 98 is OFF, and the output of the NOR gate 95 is also at the low level so that the NMOS transistor 92 is OFF. Therefore, the first discharge circuit and the second discharge circuit are OFF when the first control signal is high. The precharge circuit is ON because the inverted level of the first control signal VA is provided to the gate of the PMOS transistor 91 through the inverter 94, so that the node Vo91 is at the high level. In switching to the data output operation, the potential of the first control signal changes from the high level to the low level and a high level potential is provided to the gate of the PMOS transistor 91, turning PMOS transistor 91 OFF. Since node Vo91 is initially high, the output of the inverter 96 is initially at the low level; the low level output of inverter 96 sets NOR gate 97 at the low level. Further, the first control signal VA of the low level is provided to the NOR gates 95 and 97, so that the output potential from each of the NOR gates 95 and 97 is initially at the high level. Therefore the NMOS transistors 92 and 98 are initially ON. The potential of the node Vo91 initially discharges through both the current paths I91 and I92. When the potential of the node Vo91 is equal to the threshold voltage potential of the PMOS output transistor 93, the output of the inverter 96 preferably switches from the low level to the high level because the threshold voltage of the inverter 96 is preferably made equal to the threshold voltage of the PMOS output transistor 93. When the output of the inverter 96 switches to the high level, the output of the NOR gate 97 is set to the low level, so that the NMOS transistor 98 switches OFF. Therefore, the current path I92 is cut, turning the second discharge circuit OFF when the potential on node Vo91 falls below the threshold voltage of the PMOS transistor 93.

In the mode of operation in which the output buffer 90 generates high level data "1", the potential of the node Vo91 rapidly changes from the high level to the low level as the node Vo91 discharges through the current paths I91 and I92 in a time interval t1 to t2 shown in FIG. 6 of, for example, about 1 nanosecond, until the output transistor 93 is ON. Further discharging after time t2 occurs only along the I91 current path.

For output buffer 90, the time at which the output of NOR gate 95 switches from the low level "0" to the high level "1" may be selected to be equal to the time at which the first control signal switches to the low level from the high level when the output buffer 90 is switched to an output mode of operation. In such a case, since the first control signal VA switches to the low level, the first and second discharge circuits turn ON. Thus, the node Vo91 will initially discharge through current paths I91 and I92 and then, once the potential at the output node Vo91 falls below the threshold voltage of the PMOS transistor 93, the node Vo91 will discharge only through the current path I91.

FIG. 10 is a circuit diagram of an output buffer 100 as another embodiment of the present invention. In the embodiment of FIG. 10, when high level data "1" are read out, the potential level of the read data line /RD shown in FIG. 3A is equal to the first control signal VA. Output buffer 100 has a precharge circuit, a first discharge circuit, a second discharge circuit, an inverter 108 and a PMOS output transistor 103. The output transistor 103 is connected between the power source Vcc and an output node I/O. Node Vo101 is connected to the gate of the PMOS output transistor 103. The precharge circuit comprises a PMOS transistor 101 which is connected between a power source Vss and a node Vo101; transistor 101's gate receives the first control signal VA through the inverter 108. The first discharge circuit comprises an NMOS transistor 102 connected between the node Vo101 and a ground potential Vss. The first discharge circuit also includes a first inverter 104 connected to receive the first control signal VA at its input. The output of the first inverter 104 is connected to a gate of the NMOS transistor 102. The second discharge circuit comprises a second inverter 105, NOR gate 106 and an NMOS transistor 107. NOR gate 106 receives at one input the first control signal VA and at its other input the output of the second inverter 105. The output of the NOR gate 106 is connected to a gate of the NMOS transistor 107. The node Vo101 is connected to the input of the second inverter 105.

In this configuration of the output buffer 100, the potential of the gate (at node Vo101) of the PMOS output transistor 103 changes from the high level "1" to the low level "0" as the buffer is placed in an output operation mode. As the output buffer 100 is placed into the output operation mode, the output potential of the inverter 105 changes from the low level "0" to the high level "1" in response to the first control signal VA switching from the high level "1" to the low level "0". The potential of the control node Vo101 begins discharging through the paths I101 and I102. The time at which the output potential of the NOR gate 106 switches may be selected to be equal to the time t2 at which the potential of the node Vo101 becomes equal to the threshold voltage VH1 of the output transistor 103. To accomplish this, the threshold voltage of the inverter 105 is designed to be equal to the threshold voltage of the output transistor 103, so that the NMOS transistor 107 is OFF when the output transistor 103 turns ON (after time t2). After the time t2, the potential of the control node Vo101 is discharged only through the path I101. Here, as in the other embodiments of this invention, the matching of thresholds is preferably done so that the differences in the thresholds is sufficiently small so that insignificant noise signals are produced if the second discharge circuit has not switched OFF before the output transistor switches ON.

The operation of the output buffer 100 is basically similar to the operation of the output buffer 90 shown in FIG. 9. In the output buffer 100 shown in FIG. 10, the inverter 104 is used instead of the NOR gate 95 in the output buffer 90 shown in FIG. 9. The remainder of the configuration of the is output buffer 100 shown in FIG. 10 is same as the configuration of the output buffer 90 shown in FIG. 9. Inverter 104 functions similarly to the NOR gate 95, inverter 105 functions similarly to inverter 96, NOR gate 106 functions similarly to NOR gate 97, and NMOS transistor 107 functions like NMOS transistor 98. In the output buffer 90 shown in FIG. 9, the control of the operation (ON and OFF) of the second discharge circuit is performed by the NOR gate 97. On the other hand, in the output buffer 100 shown in FIG. 10, the control of the operation (ON and OFF) of the second discharge circuit is performed by the NOR gate 106.

As outlined above, when the output buffer 100 of the present embodiment generates the high level data "1", the potential of the node Vo101 is rapidly changed from the high level to the low level through the current paths I101 and I102 in a time interval of t1 to t2 as shown in FIG. 6 of, for example, about 1 nanosecond, until the PMOS output transistor 103 turns ON. After the PMOS output transistor 103 is ON (after time t2), the potential of the node Vo101 can be slowly changed by discharging only through a single current path I101.

FIG. 11 is a circuit diagram of another embodiment of the present invention. For the data read out operation of the high level data ↓1" illustrated by FIG. 11, the inverted potential level of the read data line /RD shown in FIG. 3A is equal to that of the first control signal VA. Output buffer 110 has a precharge circuit, a first discharge circuit, a second discharge circuit, a first inverter 116, a second inverter 117, and a PMOS output transistor 113. PMOS output transistor 113 is connected between the power source Vcc and an output node I/O; the conductance state of output transistor 113 is determined by the potential at a node Vo111 connected to the gate of output transistor 113. The precharge circuit comprises a PMOS transistor 111 connected between power source Vcc and node Vo111. The first discharge circuit comprises NMOS transistor 112 connected between the node Vo111 and ground potential Vss. The second discharge circuit comprises a third inverter 114, a fourth inverter 115 and NMOS transistors 118 and 119. The first and second inverters are connected in series, with the first inverter 116 coupled to receive the first control signal VA and to provide an output signal to the second inverter 117. The output of the second inverter 117 is provided to the gate of the PMOS transistor 111. The gate of the PMOS transistor 111 is connected to the gates of the NMOS transistors 112 and 118. Node Vo111 is connected to the input of the third inverter 114. The third inverter 114 and the fourth inverter 115 are connected in series and the output of the fourth inverter 115 is connected to the gate of the NMOS transistor 119.

In this configuration of the output buffer 110, the potential of the gate (at node Vo111) of the PMOS output transistor 113 changes from the high level "1" to the low level "0" as the buffer is placed in an output operation mode. As the output buffer 110 is placed into the output operation mode, the output potential of the inverter 114 changes from the low level "0" to the high level "1" in response to the first control signal VA switching from the high level "1" to the low level "0". The potential of the control node Vo111 begins discharging through the paths I111 and I112. The time at which the output potential of the inverter 114 switches may be selected to be equal to the time t2 at which the potential of the node Vo111 becomes equal to the threshold voltage VH1 of the output transistor 113. To accomplish this, the threshold voltages of the inverters 114 and 115 are designed to be equal to the threshold voltage of the output transistor 113, so that the NMOS transistor 119 is OFF when the output transistor 113 turns ON (after time t2). After the time t2, the potential of the control node Vo111 discharges only through the path I111.

In the non-output mode of operation for the FIG. 11 buffer, the first control signal VA is at the low level. In this case, the output of the inverter 116 is at the high level and the output of the inverter 117 is at the low level. Because the low level output of the inverter 117 is supplied to the gate of the NMOS transistor 112, the NMOS transistor 112 is OFF. In addition, the low level output of the inverter 117 is supplied to the gate of the NMOS transistor 118, so that the NMOS transistor 118 is OFF. As a result, the first and second discharge circuits are OFF. The second discharge circuit is ON only when the NMOS transistors 118 and 119 are both ON. The low level output of the inverter 117 is also supplied to the gate of the PMOS transistor 111 in the precharge circuit, so that the PMOS transistor 111 is ON, the potential at node Vo111 is at the high level and the PMOS output transistor 113 is OFF.

Because the node Vo111 is at the high level, the output of the inverter 114 is at the low level and the output of the inverter 115 is at the high level. In this case, although the NMOS transistor 119 is ON, the second discharge circuit is OFF because the NMOS transistor 118 is OFF. When the potential of the first control signal VA is changed from the low level to the high level, the high level is supplied to the gate of the PMOS transistor 111, switching it OFF. Because the NMOS transistors 112 and 118 are ON, the first discharge circuit is ON. The potential of the node Vo111 is discharged through the current paths I111 and I112. In the time period when the potential of the node Vo111 is over the threshold voltage of the PMOS transistor 113, the output of the inverter 114 switches to the high level. Therefore the output of the inverter 115 switches to the low level. When the output of the inverter 115 reaches the low level, the NMOS transistor 119 turns OFF. Therefore the second discharge circuit is OFF. As the result, the current path I112 is cut. The potential of the node Vo111 is discharged only through the current path I111. Accordingly, when the output buffer 110 of the present embodiment generates the high level data "1", the potential of the node Vo111 is rapidly changed from the high level to the low level as the node Vo111 discharges through the current paths I111 and I112 thereby turning the output transistor 113 ON over the time interval from t1 to t2 as shown in FIG. 6, which may be about 1 nanosecond. After the output transistor 113 is ON (after the time t2 shown in FIG. 6), the potential of the node Vo111 can be slowly changed by discharging the node Vo111 through only a single current path I112.

In FIG. 11, the first control signal VA is supplied to the PMOS transistor 111 through the two inverters 116 and the 117, but the same general effect can be obtained in the case that the two inverters 116 and 117 are not present in the output buffer 110. In the embodiments of the output buffer of the present invention, as shown in FIGS. 5, 7, 8, 9, 10, and 11, the output transistors are connected between the power source potential Vcc and the output node I/O and generate the high level data "1". However, similar configurations may be implemented for the cases where the output transistor is connected between the output node I/O and the ground potential Vss so that the buffer is used to generate low level output data signals "0".

Figure 12:
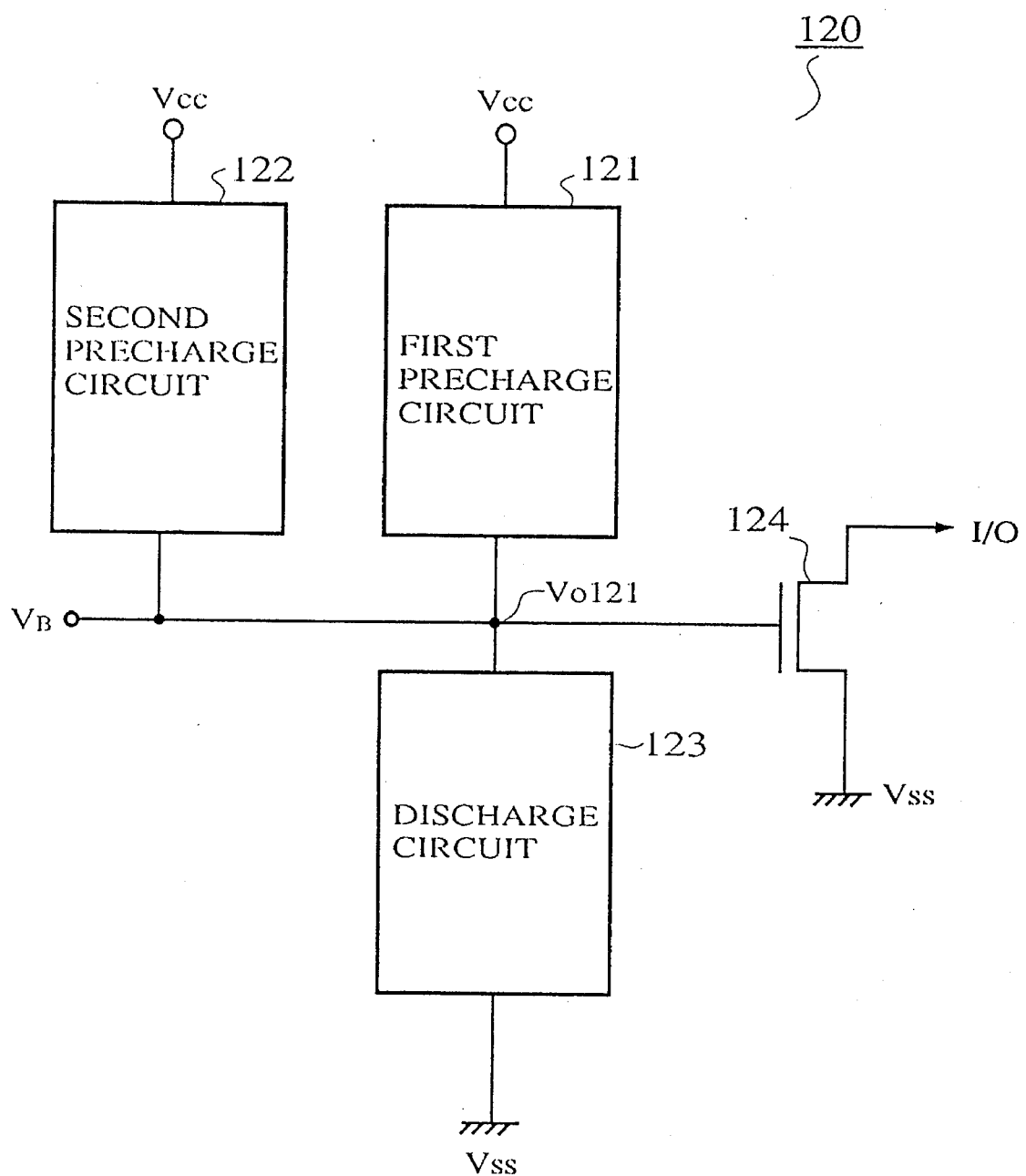
FIG. 12 is a schematic diagram of an output buffer according to the present invention incorporated in the semiconductor memory device of FIG. 3A.

FIG. 12 schematically illustrates a general configuration of an output buffer of the present invention that might be used within the semiconductor integrated circuit shown in FIG. 3A. Output buffer 120 generates low level data "0" output at node I/O corresponding to low level data stored in a memory cell. Referring to FIG. 12, output buffer 120 includes a first precharge circuit 121, a second precharge circuit 122 connected between the power potential Vcc and a node Vo121, a discharge circuit 123 and a NMOS output transistor 124. The first precharge circuit 121 charges the node Vo121 during the output operation mode of the buffer 120, while the second precharge circuit 122 has the function of charging the node Vo121 in conjunction with the first precharge circuit 121 during a portion of the transition to the buffer's output operation mode. The charging operation of the second precharge circuit is halted when the potential of the node Vo121 rises to a specific level, which is preferably on the order of the threshold voltage of the NMOS output transistor 124. The discharge circuit 123 is connected between the node Vo121 and the ground potential Vss and acts to discharge the node Vo121 during the transition to the non-output operation mode of the buffer and to keep the node in the low level state. The gate of NMOS output transistor 124 is connected to the node Vo121, the drain is connected to the output node I/O and the source is connected to the ground potential Vss. Output transistor 124 is a drive element which generates the low level data "0" at the output node I/O during an output operation.

Figure 13:
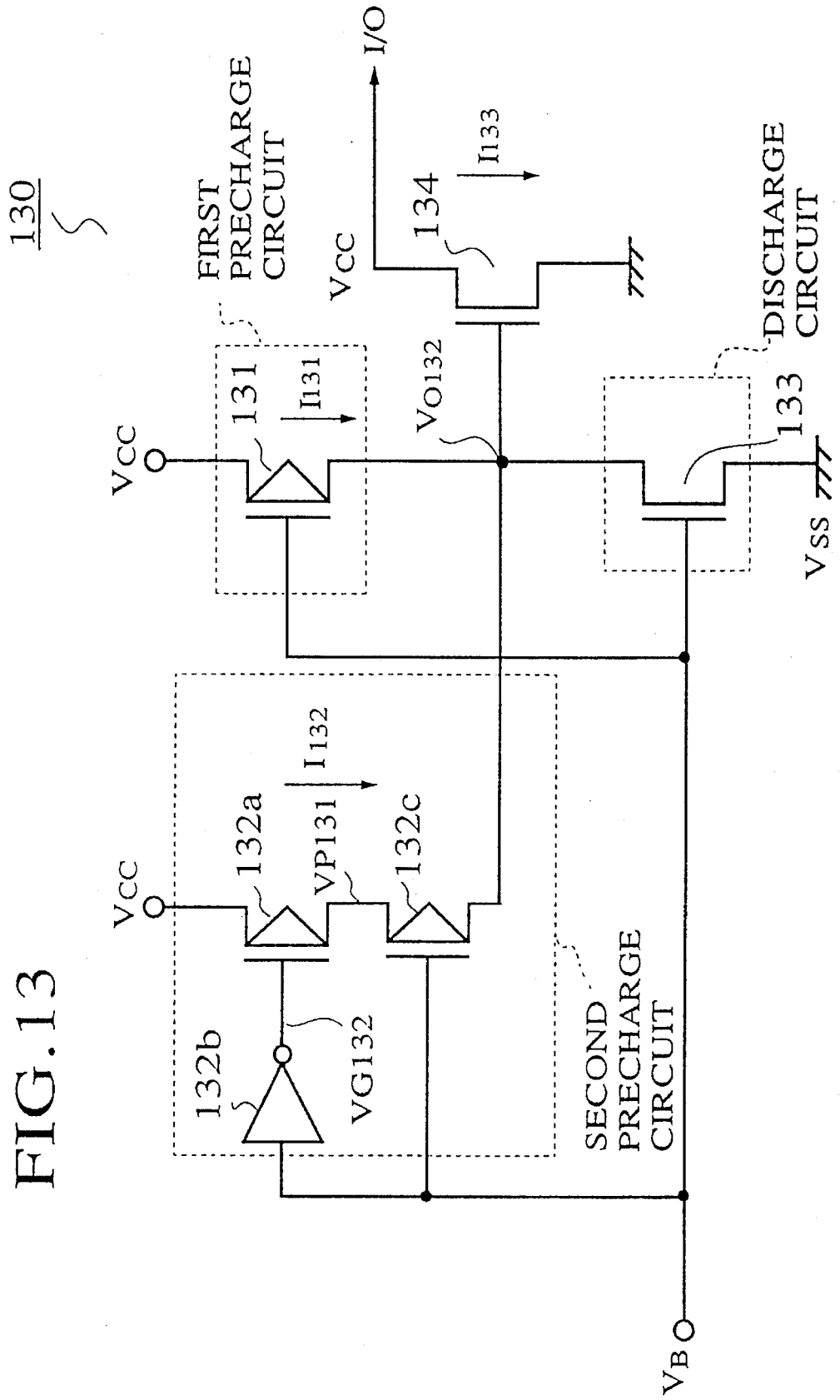
FIG. 13 is a circuit diagram showing a more detailed diagram of the output buffer shown in FIG. 12 for generating a low level data "0".

FIG. 13 illustrates one embodiment of the FIG. 12 buffer. Output buffer 130 includes a PMOS transistor 131 within the first precharge circuit for precharging the node Vo132 to the high level "1" during the output operation mode. The source of the output transistor 131 is connected to the power source potential Vcc and the drain of the PMOS transistor 131 is connected to the node Vo132. The second precharge circuit comprises a PMOS transistor 132a, an inverter 132b and a PMOS transistor 132c. PMOS transistors 132a and 132c operate in combination to precharge the node Vo132 to the high level during the output operation mode. The source of the PMOS transistor 132a is connected to the power source potential Vcc and the drain of the PMOS transistor 132a is connected to a node VP131. The source of the PMOS transistor 132c is connected to the node VP131 and the drain of the PMOS transistor 132c is connected to the node Vo132. NMOS transistor 133 is part of the discharge circuit which discharges node Vo132 to the low level to place the output buffer 130 in the non-output operation mode. The drain of the NMOS transistor 133 is connected to the node Vo132 and the source of the NMOS transistor 133 is connected to the ground potential Vss.

A control signal VB, which is at the low level "0" during the output operation mode and at the high level "1" during the non-output operation mode, is supplied to the gates of each of the PMOS transistors 131 and 132c, to the gate of NMOS transistor 133 and to the input gate of the inverter 132b. The inverter 132b inverts the signal VB and provides the inverted signal at node VG132 to the gate of the PMOS transistor 132a.

Figure 14:
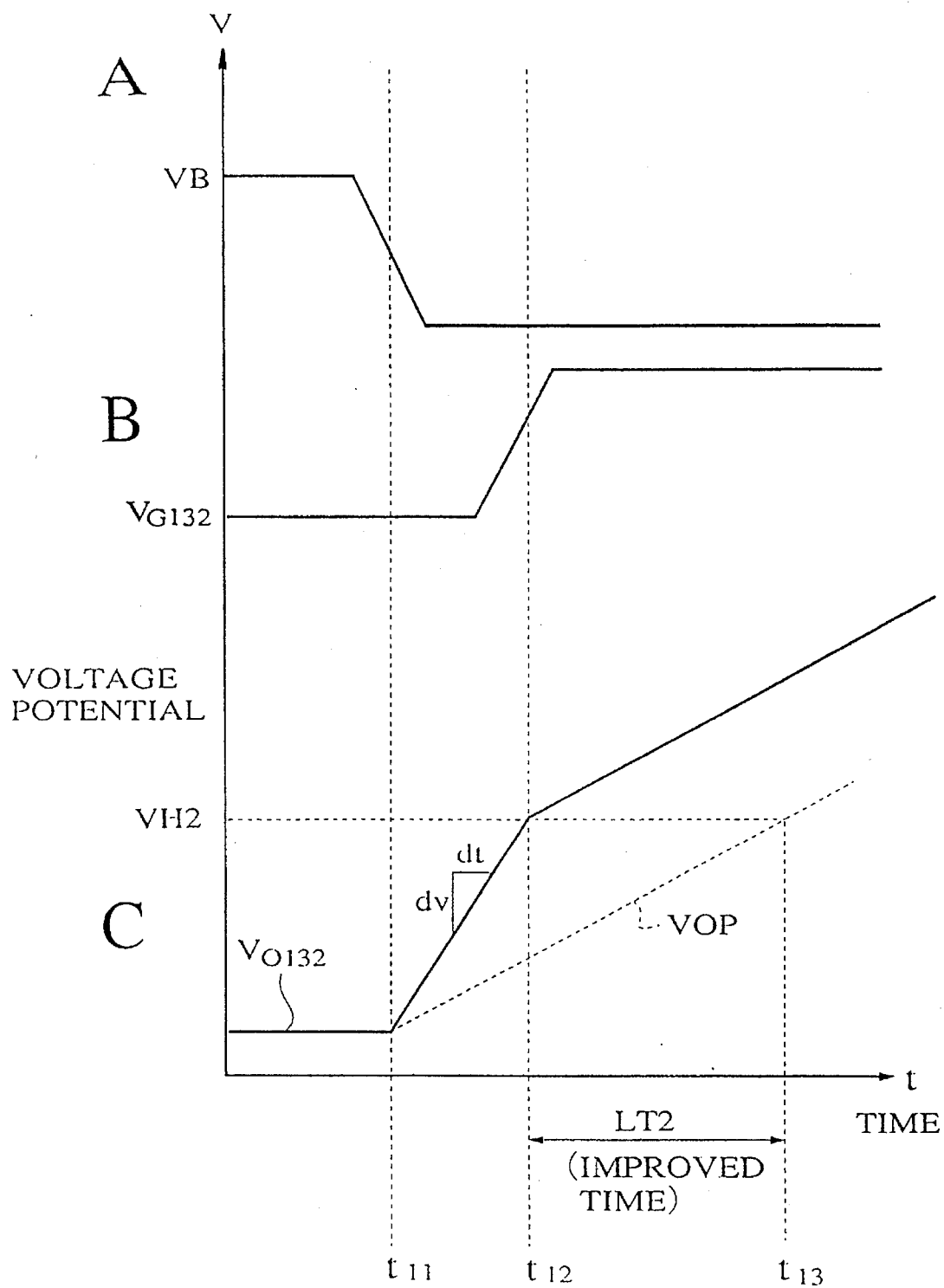
FIG. 14 is a timing chart showing the operation of the output buffer shown in FIG. 13.

Next, the operation of the output buffer 130 shown in FIG. 13 of the embodiment will be explained with reference to the timing chart of FIG. 14. Prior to a time t11, the buffer 130 is in a non-output operation mode, PMOS transistors 131 and 132c are OFF, and only the NMOS transistor 133 of the discharge circuit is ON. The states of these transistors are determined by the high level data of the second control signal VB supplied to the gates of each of the PMOS transistor 131, the NMOS transistor 133, the NMOS transistor 132, and to the input of the inverter 132b. Consequently, a low level signal is supplied to the gate of the NMOS output transistor 134 so that the output transistor 134 is kept in the OFF state. When the buffer is in a non-output operation mode, the output node is in a high impedance state.

At time t11, the output node VG132 of the inverter 132 is at the low level, the PMOS transistor 132a is ON, and the potential of the node VP131 is charged to the high level "1" because the low level potential of the output node VG132 is supplied to the gate of the PMOS transistor 132a. In the transfer to the output operation mode, the second control signal VB is changed from the high level "1" to the low level "0". After the time t11 has passed and the potential of the second control signal VB has been changed from the high level to the low level, the current path to the ground potential Vss through the NMOS transistor 133 is cut, while the PMOS transistor 131 and the PMOS transistor 132c are ON because the low level is supplied to the gates of each of the PMOS transistor 131 and the PMOS transistor 132c. As a result, the power source potential Vcc is supplied to the node V0132 through the current path I131 (comprising the PMOS transistor 131) and the current path I132 (comprising the PMOS transistors 132a and 132c). However, the power source potential Vcc is supplied to the node Vo132 through the current path I132 only for the time interval from time t11 to the time t12 as the potential of the node VG132 switches from the low level to the high level and the PMOS transistor 132a turns OFF. This time interval in the second precharge circuit of the FIG. 13 buffer is introduced by the delay in switching associated with the inverter 132b.

The potential of node Vo132 is changed from the low level to the high level by the flow of current into node Vo132 along the current paths I131 and I132 from the power source Vcc. As a result, the high level data "1" is supplied to the gate of the output transistor 134 and the output transistor NMOS 134 is turned ON. A current path I133 is formed from the output node I/O to the ground potential Vss, so that the output buffer 130 generates the low level data "0".

Here, the potential of the gate of the NMOS output transistor 134 switches from the low level "0" to the high level "1" as the node Vo132 charges through the current paths I131 and I132. Preferably, the delay time required for the output potential of the inverter 132b to switch from the low level "0" to the high level "1" is set to be the time t2 required for the potential of the node Vo132 to charge to the threshold voltage VH2 of the output transistor 134. If the inverter 132b is, for example, a CMOS circuit, then the delay time of inverter 132b is determined by how long it takes for sufficient charge to flow through a PMOS transistor (not shown) to charge the node VG132. This charging operation is illustrated in FI6. 14 by the curve VG2. The delay time of the inverter 132b may thus be chosen so that the inverter 132b is on as long as necessary for the node Vo132 to charge sufficiently to turn ON the NMOS transistor 134. In this case, the transistor PMOS transistor 132a switches OFF when the potential of the node Vo132 is equal to the threshold voltage VH2 of the output transistor 134. Thus, after the time t12, the rate at which the voltage changes at the voltage node Vo132 is reduced after the output transistor 134 switches ON because the node Vo132 charges only through the single current path I131. When the output buffer 130 generates the low level data "0" at the output node I/O, the gate level Vo132 is rapidly changed through the current paths I131 and I132 in the time interval t11 to t12 shown in FIG. 14 of for example, about 1 nanosecond, until the output transistor 134 switches ON. Thus, the noise characteristics and improved switching speeds of the FIG. 13 buffer are similar to those achieved in the high level output buffers illustrated in FIGS. 5, 7 and 8.

After the output transistor 134 is ON (after the time t12) the gate level Vo132 can be slowly changed to achieve improved noise performance. Additionally, because the rate of change of the gate potential Vo132 (dV/dt) of the output buffer 134 can be selectively made small during the period when the output transistor 134 is ON, the increase in the switching time associated with reducing the noise output signal of the output transistor 134 can be minimized. The buffer illustrated in FIG. 13 achieves faster switching than does the conventional buffer illustrated in FIG. 1. The dotted line VOP shown in FIG. 14 illustrates the switching performance achieved for the FIG. 1 buffer when the rate of change (dV/dt) of the gate potential of the output transistor is held sufficiently small to achieve reduced noise performance. As shown by the dotted line VOP in FIG. 14, the time required in the FIG. 1 buffer for the potential of the node Vo132 to reach the threshold voltage VH2 of the output transistor (designated by the time t13) is longer than the corresponding time t12 achieved for the buffer of FIG. 13 by a delay LT2 of, for example, about 2 nanoseconds. Thus, it is possible in the FIG. 13 buffer to reduce the amount of swing (voltage fluctuations) in the internal power of the chip (output noise) without increasing the buffer switching time as much as would be required to achieve similarly reduced output noise levels in the conventional buffer.

Figure 15:
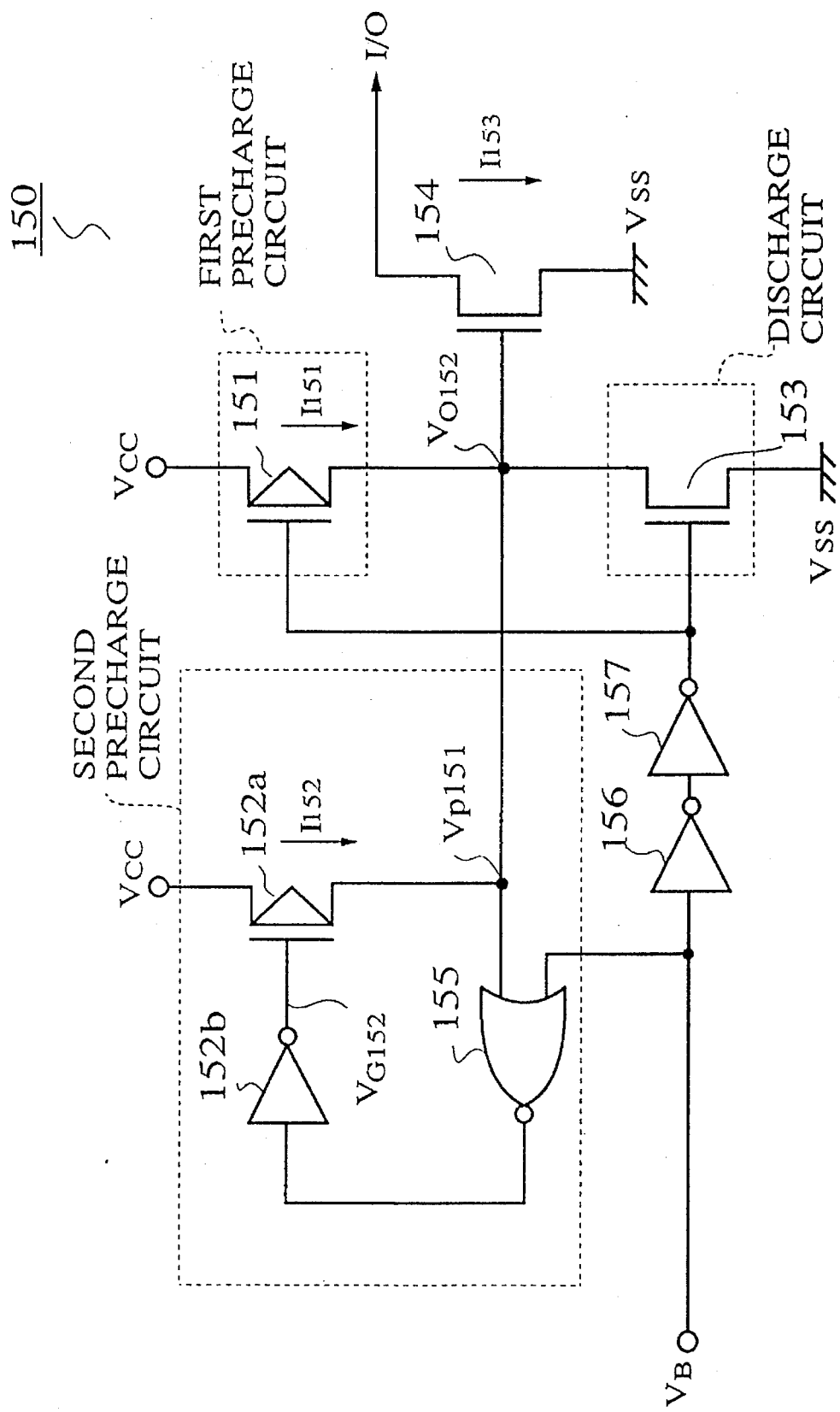
FIG. 15 is a circuit diagram showing another more detailed diagram of the output buffer shown in FIG. 13.

FIG. 15 shows another embodiment of the present invention. Output buffer 150 comprises: a first precharge circuit; a second precharge circuit consisting of PMOS transistor 152a, inverter 152b and NOR gate 155; an NMOS output transistor 154; a discharge circuit 153, and a pair of inverters 156 and 157 connected in series. In the second precharge circuit, the gate of the PMOS transistor 152a is connected to the output of inverter 152b which receives the output of NOR gate 155. One input of the NOR gate 155 is connected to the gate of the output transistor 154 (i.e., node Vo152) and the other input of NOR gate 155 is connected to receive the second control signal (preferably provided by the memory circuit shown in FIG. 3A). The PMOS transistor 151 in the first precharge circuit precharges the node Vo152 to the high level "1" during the output operation mode. The source of the output transistor 151 is connected to the power source potential Vcc and the drain of the PMOS transistor 151 is connected to the node V0152. The second precharge circuit comprises a PMOS transistor 152a, inverter 152b and NOR gate 155. The PMOS transistor 152a precharges the node Vo152 (and the node Vp151) to the high level "1" during the output operation mode. The source of the PMOS transistor 152a is connected to the power source potential Vcc and the drain of the PMOS transistor 152a is connected to a node VP151 (Vo152). The gate of the PMOS transistor 152a is connected to inverter 152b at the inverter's output node VG152. In the discharge circuit, NMOS transistor 153 operates to discharge the node V0152 to the low level during the non-output operation mode. The drain of the NMOS transistor 153 is connected to the node V0152 and the source of the NMOS transistor 153 is connected to the ground potential Vss.

By this configuration of the output buffer 150 shown in FIG. 15, it is possible to reduce the time delay associated with limiting the swing (voltage fluctuations) in the internal power of the chip (output noise) at the output node I/O of the buffer 150 when it is used within the buffer 370 in the memory device illustrated in FIG. 3A.

Figure 16:
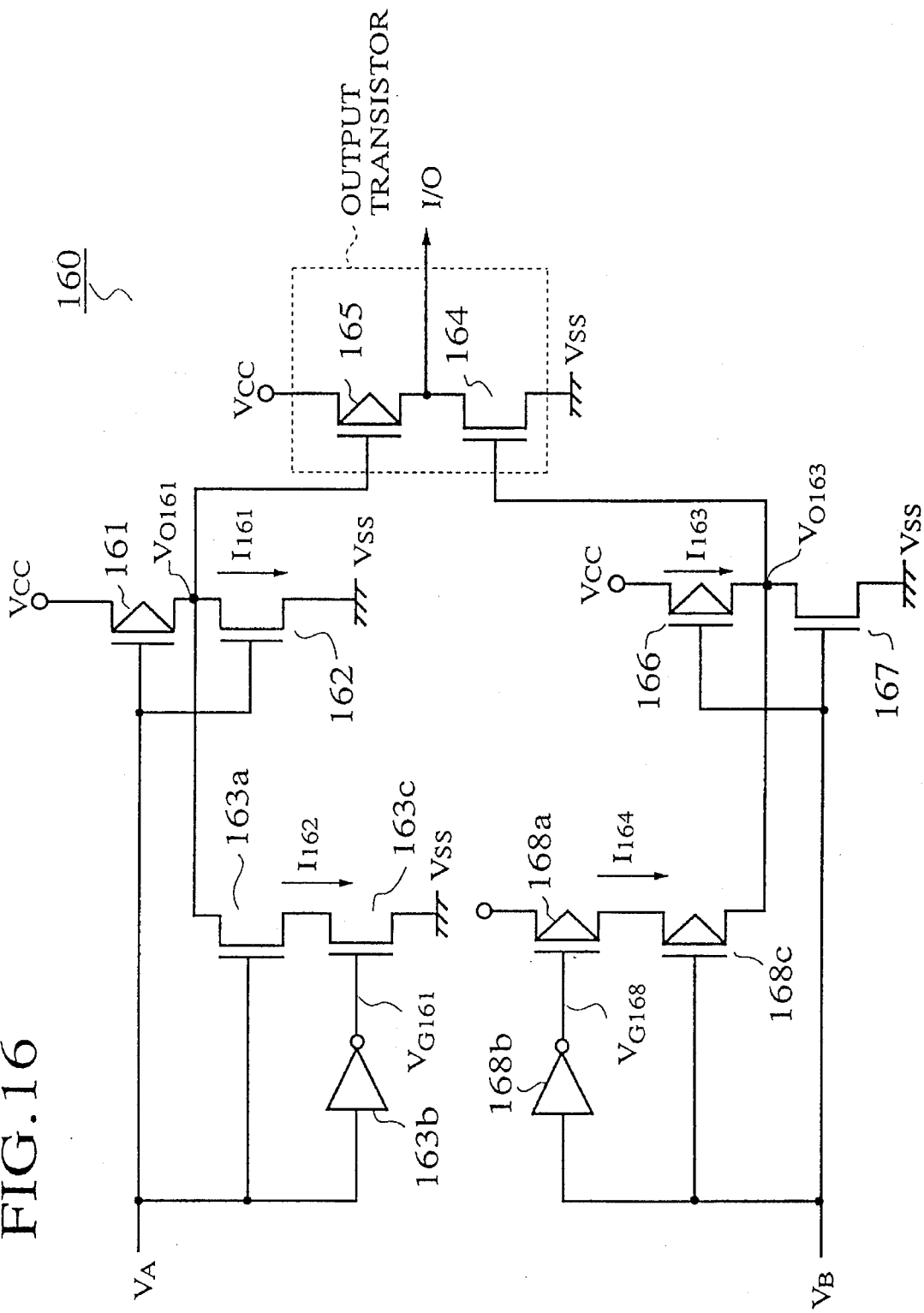
FIG. 16 is a circuit diagram showing a more detailed diagram of the output buffer for generating a high level data "1" and a low level data "0".

FIG. 16 illustrates an output buffer 160 which generates both the high level data "1" and the low level data "0". As with the other buffers discussed herein, the FIG. 16 buffer might be used in a memory device such as the one illustrated in FIG. 3A. Output buffer 160 has a combinational configuration of the configuration of the output buffer 50 for generating the high level data "1" shown in FIG. 5 and the output buffer 130 for generating the low level data "0" shown in FIG. 13. In FIG. 16, the output node I/O is connected in common to the drains of the output transistors 165 (PMOS transistor) and 164 (NMOS transistor). During the non-output operating mode, the first control signal VA is at the low level and the second control signal VB is at the high level. For the high level data "1" output operation, the second control signal VB is at the high level, and the potential of the first control signal VA is changed from the low level to the high level. In addition, when in the low level data "0" output operation, the first control signal VA is at the low level, and the second control signal VB is changed from the high level to the low level.

The operation of the present embodiment will now be explained with reference with FIG. 16. First, in the case of the high level data "1" output operation, in the same manner as in the embodiment shown in FIG. 5, the potential of the control node Vo161, which is the gate level of the output transistor 165, is discharged from the power source potential Vcc to the ground potential Vss through the current paths I161 and I162 until the output transistor 165 comes ON. During the time period when the output transistor 165 is ON, the potential of the control node Vo161 is discharged only through the current path I161. In the case of the low level data "0" output operation, in the same manner as in the embodiment shown in FIG. 13, the potential of the control node Vo162 and of the gate of the output transistor 164 is charged from the ground potential Vss to the power source potential Vcc by the flow of current through the paths I163 and I164 until the output transistor 164 comes ON. When the output transistor 164 is ON, the node Vo162 is charged only through the current path I163.

In the above manner, the output buffer 160 shown in FIG. 16 generates the high level data "1" output or the low level data "0" output by discharging or charging the gate of the output transistor using two distinct current paths until the output transistor turns ON. After the desired output transistor turns ON, the discharging or charging to the gate of the output transistor can be performed through one current path. Accordingly, for generating either the high level data "1" output or the low level data "0" output, the rate of change of the voltage at the gate of the output transistor need only be kept small during the time period when the output transistor is ON.

Figure 17:
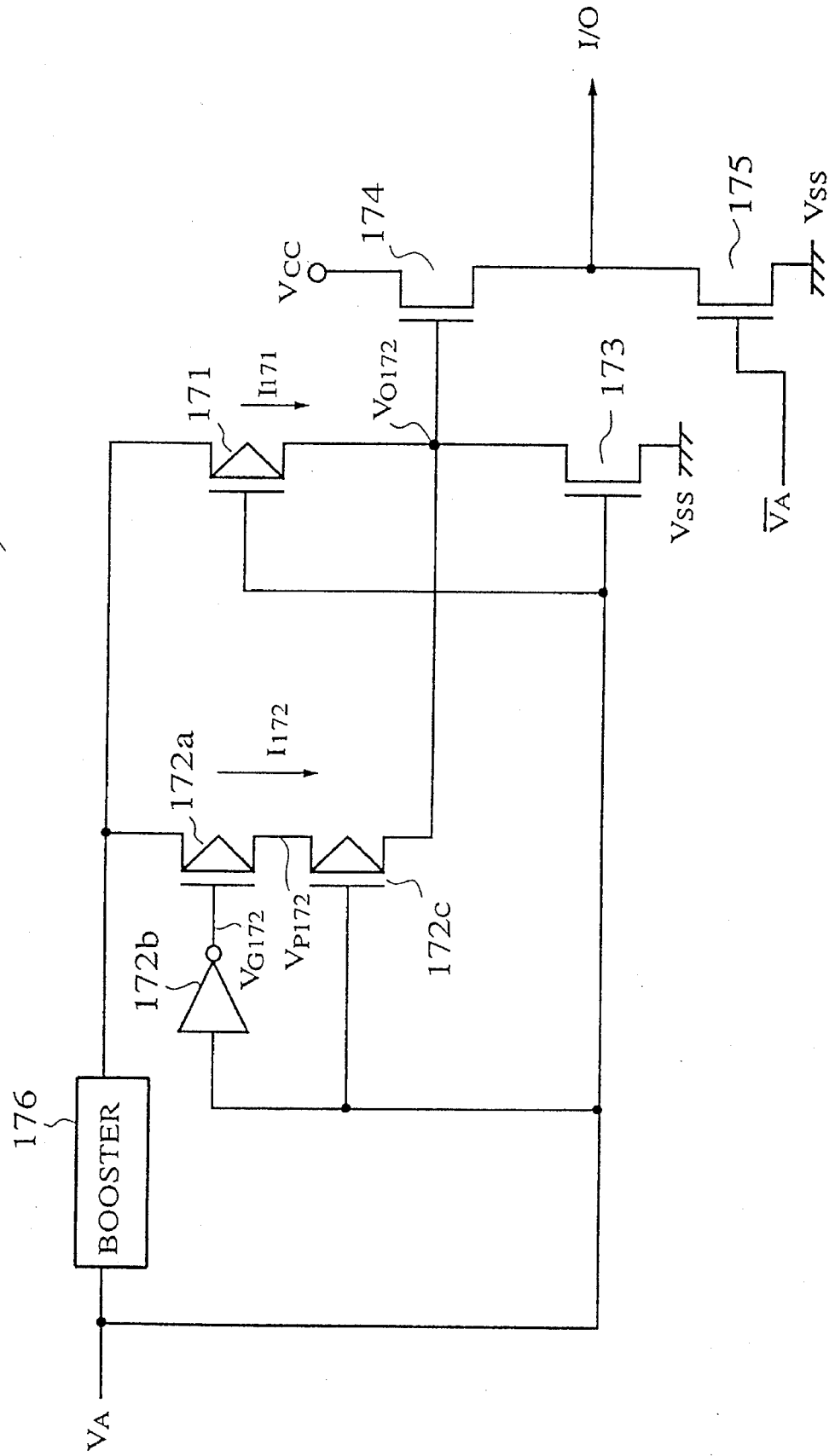
FIG. 17 is a circuit diagram of an output buffer relating to another embodiment of the present invention.

FIG. 17 is a circuit diagram related to another embodiment of the present invention. Buffer circuit 170 is an output buffer which uses NMOS output transistors to output high level data from the I/O node. The FIG. 17 buffer circuit is in many ways similar to the output buffer 130 shown in FIG. 13, except that the output buffer 130 drives a single NMOS output transistor, outputs low level data and operates using the chip's operating voltage. In the output buffer 170 shown in FIG. 17, a booster circuit 176 for boosting the voltage of the first control signal VA is provided in addition to the components of the above-mentioned embodiment shown in FIG. 13. The output voltage of the booster circuit 176 is supplied to the source of the PMOS transistors 171, 172b instead of the power source potential Vcc. In addition to this, the drain of the NMOS output transistor 174 is connected to the power source potential Vcc, the source of the NMOS output transistor 174 is connected to the output node I/O, the drain of an NMOS output transistor 175 is connected to the output node I/O and the source of the NMOS output transistor 175 is connected to the ground potential Vss. A signal /VA (which is the inverted first control signal VA) is supplied to the gate of the NMOS output transistor 175. In the output buffer 170, when the potential of the first control signal VA is at the low level, the booster circuit 176 outputs a potential to the output transistor 174 of preferably no more than a threshold voltage VH2 over the power potential Vcc. The output of the booster circuit is supplied to the sources of the PMOS transistors 171, 172a.

During the high level data "1" output, the first control signal VA is changed from the high level to the low level and the control node Vo172 is initially charged from the ground source potential Vss to the power source potential Vcc through the current paths I171 and I172. When VA switches from high to low, the potential on the gate of transistor 172c immediately switches to the low level, but the output or inverter 172b does not switch until after the delay of inverter 172b passes. Thus, for the time period equal to the delay of inverter 172b, both PMOS transistors 172a and 172c are ON, so that node Vo172 is charged through both the I171 and I172 current paths. After the delay of inverter 172b passes, the node Vo172 charges only through the current path I171. It is preferable that the delay of inverter 172b be chosen so that the current path I172 is switched OFF during the time period when the output transistor 174 is ON. Accordingly, in the case of the high level data "1" output, in the same manner as in the output buffer 130 shown in FIG. 13, the rate at which the voltage changes at the gate of output transistor 174 is maintained small only during the time period when the output transistor is ON. High speed can be achieved in the FIG. 17 buffer because the NMOS output transistor 174 has a comparatively large drive capacity and because a boosted voltage is supplied to the PMOS charging circuits. Because the booster circuit generates a voltage higher than Vcc and supplies that boosted voltage through PMOS transistors 171, 172a and 172c to the NMOS transistor 174, the booster circuit acts to compensate for the voltage drop across the PMOS transistors and serves to turn the transistor 174 ON more quickly and completely.

It should be noted that individual buffers for the output of either high level data or low level data have generally been described herein. It is of course common to include both a high level data output buffer and a low level data output buffer as the output buffer 370 used in the memory device illustrated in FIG. 3A. Accordingly, any of the individual buffer types described above can be combined together to form an output buffer circuit capable of outputting both high level and low level data. In the interest of providing a concise description of the present invention, only a selection of exemplary embodiments have been set forth in detail. This is not intended to limit the teachings of the present invention. For example, it will be apparent to those of ordinary skill that at least portions of the circuits described for the output of high level data could be adapted for the output of low level data.

By means of the present invention which has been explained in detail described above, it is possible to keep the rate of change of the voltage at a control node (which is connected to the gate of an output transistor) small only during the period when the output transistor is ON. It is possible to reduce the output noise while minimizing the level of added delay associated with reducing the level of voltage fluctuations on the gate of the output transistor. In addition, in the present invention, direct detection of the potential of the control node is possible when the discharge transistor is ON, because a secondary discharge circuit is formed so that a third transistor turns OFF when the drop of the potential of the control node to a predetermined voltage level is detected. The discharge operation in the provision discharge circuit can therefore be halted accurately when the control node reaches a predetermined level. Accordingly, the output noise can be reduced while not unacceptably increasing the delay in the switching speed of the buffer. By the present invention, the delay until a first output transistor or a second output transistor comes ON can be minimized and therefore the output noise can be reduced because it is possible to reduce the rate of change of the potential of a first or a second control node respectively only during the period when the respective first or second output transistor is ON.

While the above provides a full and complete disclosure of the preferred embodiments of the present invention, various modifications, alternate constructions and equivalents any be employed without departing from the true spirit and scope of the invention. Therefore the above description and illustration should not be construed as limiting the scope of the invention, which is defined by the appended claims.

What is claimed is:

1. An output buffer having an input terminal and an output terminal, the input terminal receiving a control signal and the output terminal outputting high level data in response to the control signal, comprising:
    a precharge circuit comprising a first PMOS transistor connected between a power source and a control node, a gate of the first PMOS transistor being connected to the input terminal, the precharge circuit charging the control node to a voltage potential;
    a first discharge circuit, connected between the control node and a ground source, for discharging the voltage potential of the control node;
    a second discharge circuit, connected between the input terminal and the control node, for discharging the voltage potential of the control node;
    an output transistor comprising a second PMOS transistor connected between the power source and the output terminal, a gate of the second PMOS transistor being connected to the control node, the second PMOS transistor generating the high level data at the output terminal in response to the voltage potential of the control node,
    wherein the precharge circuit stops charging the control node in response to the control signal, and the first discharge circuit and the second discharge circuit both begin discharging the control node in response to the first control signal, and
    the second discharge circuit stops discharging the control node before the second PMOS transistor is substantially turned on, while the first discharge circuit continues to discharge the control node until the second PMOS transistor is substantially turned on.

2. An output buffer as claimed in claim 1,
    wherein the first discharge circuit comprises a first NMOS transistor, a gate of the first NMOS transistor being connected to the gate of the first PMOS transistor and the input terminal,
    the second discharge circuit comprises a second NMOS transistor and a third NMOS transistor connected in series between the control node and the ground source, and a first inverter connected between the input terminal and the gate of the third NMOS transistor, a gate of the second NMOS transistor being connected to the input terminal, and
    wherein a threshold voltage of the first inverter is approximately equal to the threshold voltage of the second PMOS transistor.

3. An output buffer as claimed in claim 1, further comprising first and second inverters placed between the gate of the first PMOS transistor and the input terminal, wherein the first discharge circuit comprises:
    a first NMOS transistor, a gate of the first NMOS transistor being connected to the gate of the first PMOS transistor, and the second discharge circuit comprises:
    a second NMOS transistor connected between the control node and the ground source;
    a NAND gate, one input terminal of the NAND gate being connected to the control node and another input terminal of the NAND gate being connected to the input terminal; and
    a third inverter connected between the gate of the second NMOS transistor and the NAND gate, and
    wherein a threshold voltage of the NAND gate is approximately equal to the threshold voltage of the second PMOS transistor.

4. An output buffer as claimed in claim 1, further comprising:
    a third PMOS transistor and a fourth PMOS transistor connected in series between the power source and the control node,
    wherein the first discharge circuit comprises:
    a first NMOS transistor, a gate of the first NMOS transistor being connected to the gate of the first PMOS transistor,
    the second discharge circuit comprises:
    a first inverter connected between a gate of the third PMOS transistor and the input terminal, wherein a gate of the fourth PMOS transistor is connected to the input terminal; and
    a second NMOS transistor and a third NMOS transistor connected in series between the control node and the ground source, wherein a gate of the second NMOS transistor is connected to the input terminal through a second inverter, a gate of the third NMOS transistor is connected to the input terminal, and the gate of the first PMOS transistor and the gate of the first NMOS transistor are connected to the input terminal, and
    wherein a threshold voltage of the first inverter is approximately equal to the threshold voltage of the second PMOS transistor.

5. An output buffer as claimed in claim 1, further comprising a first inverter connected between the input terminal and the gate of the first PMOS transistor,
    wherein the first discharge circuit comprises:
    a first NMOS transistor connected between the control node and the ground source; and
    a first NOR gate, one input of the first NOR gate being connected to the ground source and another input of the first NOR gate being connected to the input terminal, and an output of the first NOR gate being connected to a gate of the first NMOS transistor,
    the second discharge circuit comprises:
    a second NOR gate, one input of the second NOR gate being connected to the input terminal;
    a second inverter connected between the control node and another input of the second NOR gate; and
    a second NMOS transistor connected between the control node and the ground source, a gate of the second NMOS transistor being connected to an output of the second NOR gate, and
    wherein a threshold voltage of the second inverter is approximately equal to the threshold voltage of the second PMOS transistor.

6. An output buffer as claimed in claim 1, further comprising a first inverter connected between the input terminal and the gate of the first PMOS transistor,
    wherein the first discharge circuit comprises:
    a first NMOS transistor connected between the control node and the ground source; and a second inverter connected between the gate of the first NMOS transistor and the input terminal, wherein the second discharge circuit comprises:
- a second NMOS transistor connected between the control node and the ground source;
- a first NOR gate, one input of the first NOR gate being connected to the input terminal, an output of the first NOR gate being connected to the gate of the second NMOS transistor; and
- a third inverter connected between the control node and another input of the first NOR gate, and wherein a threshold voltage of the third inverter is approximately equal to the threshold voltage of the second PMOS transistor.

7. An output buffer as claimed in claim 1, further comprising first and second inverters connected in series between the input terminal and the gate of the first PMOS transistor, wherein the first discharge circuit comprises a first NMOS transistor connected between the control node and the ground source, and the second discharge circuit comprises:
- a second NMOS transistor and a third NMOS transistor connected in series between the control node and the ground source; and
- a third inverter and a fourth inverter connected in series between the control node and a gate of the third NMOS transistor, wherein a gate of the second NMOS transistor is connected to the gates of the first NMOS transistor and the first PMOS transistor, and wherein a threshold voltage of the third inverter and the fourth inverter is approximately equal to the threshold voltage of the second PMOS transistor.

8. An output buffer having an input terminal and an output terminal, the input terminal receiving a control signal and the output terminal outputting low level data in response to the control signal, comprising:
- a discharge circuit comprising a first NMOS transistor connected between a ground source and a control node, a gate of the first NMOS transistor being connected to the input terminal, the discharge circuit discharging a voltage potential of the control node to a voltage potential of the ground power source;
- a first precharge circuit for charging the control node, the first precharge circuit connected between the control node and a power source;
- a second precharge circuit for charging the control node, the second precharge circuit connected between the input terminal and the control node;
- an output transistor comprising a second NMOS transistor connected between the ground source and the output terminal, a gate of the second NMOS transistor being connected to the control node, the second NMOS transistor generating the low level data in response to the voltage potential of the control node, wherein the discharge circuit stops discharging the control node in response to the control signal, the first precharge circuit and the second precharge circuit both begin charging the control node in response to the control signal, and the second precharge circuit stops charging the control node before the second NMOS transistor is substantially turned on, while the first precharge circuit continues to charge the control node until the second NMOS transistor is substantially turned on.

9. An output buffer as claimed in claim 8, wherein the first precharge circuit comprises a first PMOS transistor connected between the power source and the control node, the second precharge circuit comprises:
- a first inverter connected between the second precharge circuit and the input terminal; and
- a second PMOS transistor and a third PMOS transistor connected in series between the power source and the control node, wherein a gate of the second PMOS transistor is connected to the input terminal through the first inverter and a gate of the third PMOS transistor is connected to the input terminals, and wherein a threshold voltage of the first inverter is approximately equal to the threshold voltage of the second NMOS transistor.

10. An output buffer as claimed in claim 8, further comprising:
- a first inverter connected between the second precharge circuit and the input terminal;
- a NOR gate having one input connected to the input terminal and a second input connected to the gate of the second NMOS transistor; and
- second and third inverters connected in series between the input terminal and the gate of the first NMOS transistor, wherein the first precharge circuit comprises a first PMOS transistor connected between the power source and the control node, the second precharge circuit comprises a second PMOS transistor connected in series between the power source and the control node, wherein a gate of the second PMOS transistor is connected to an output of the NOR gate through the first inverter, and wherein a threshold voltage of the first inverter is approximately equal to the threshold voltage of the second NMOS transistor.

11. An output buffer having first and second input terminals and an output terminal, the first input terminal receiving a first control signal, the second input terminal receiving a second control signal, the output terminal providing high level data in response to the first control signal, and the output terminal providing low level data in response to the second control signal, the output buffer comprising:
- a first PMOS transistor for charging a first control node, where the first PMOS transistor is connected to a high power source and to the first control node, and where a gate of the first PMOS transistor is connected to the first input terminal;
- a first discharge circuit for discharging the voltage potential of the first control node, comprising a first NMOS transistor connected between the first control node and a ground source, a gate of the first NMOS transistor being connected to the gate of the first PMOS transistor;
- a second discharge circuit for discharging the voltage potential of the first control node, comprising:
  - a second NMOS transistor and a third NMOS transistor connected in series between the first control node and the ground source, and
  - a first inverter connected between the first input terminal and the gate of the third NMOS transistor, a gate of the second NMOS transistor being connected to the first input terminal;

a second PMOS transistor for generating the high level data in response to a voltage potential of the first control node, where the second PMOS transistor is connected between the high power source and the output terminal, and where a gate of the second PMOS transistor is connected to the first control node;

a fourth NMOS transistor for discharging a second control node, where the fourth NMOS transistor is connected between the ground source and the second control node, and where a gate of the fourth NMOS transistor is connected to the second input terminal;

a first precharge circuit for charging the voltage potential of the second control node, comprising a third PMOS transistor connected between the second control node and the power source, a gate of the third PMOS transistor being connected to the gate of the fourth PMOS transistor;

a second discharge circuit for discharging the voltage potential of the second control node, comprising:
 a fourth PMOS transistor and a fifth PMOS transistor connected in series between the second control node and the power source; and
 a second inverter connected between the second input terminal and the gate of the fourth PMOS transistor, a gate of the fifth NMOS transistor being connected to the second input terminal; and a fifth NMOS transistor for generating the low level data in response to a voltage potential of the second control node, where the first NMOS transistor is connected between the ground power source and the output terminal, and where a gate of the fifth NMOS transistor is connected to the second control node, wherein the first PMOS transistor stops charging the first control node in response to the first control signal, the first NMOS transistor and the second and third NMOS transistors begin discharging the first control node in response to the first control signal, the second and third NMOS transistors stop discharging the first control node when the voltage potential of the first control and is approximately equal to or less than a threshold voltage potential of the second PMOS transistor, and the fourth NMOS transistor stops discharging the second control node in response to the second control signal, the third PMOS transistor and the fourth and fifth PMOS transistors begin charging the second control node in response to the second control signal, the fourth and fifth PMOS transistors stop charging the second control node when the voltage potential of the second control node is equal to or less than a threshold voltage potential of the fifth NMOS transistor, and wherein a threshold voltage of the first inverter is equal to the threshold voltage of the second PMOS transistor and a threshold voltage of the second inverter is equal to the threshold voltage of the second NMOS transistor.

12. An output buffer having a first input terminal and an output terminal, the first input terminal receiving a first control signal, the output terminal providing high level data in response to the first control signal, the output buffer comprising:

a booster connected to the first input terminal for receiving the first control signal and generating a boosted voltage greater than a voltage potential of a high power source;

a first PMOS transistor for charging a control node, where the first PMOS transistor is connected between the booster and the control node, and where a gate of the first PMOS transistor is connected to the first input terminal;

a first NMOS transistor connected between the control node and a ground source, where a gate of the first NMOS transistor is connected to the first input terminal;

a second NMOS transistor for providing the high level data to the output terminal, where the second NMOS transistor is connected between the high power source and the output terminal, and where a gate of the second NMOS transistor is connected to the control node;

a second PMOS transistor and a third PMOS transistor connected in series between the booster and the control node, where a gate of the third PMOS transistor is connected to the first input terminal; and an inverter connected between the first input terminal and a gate of the second PMOS transistor, wherein a threshold voltage of the inverter is equal to the threshold voltage of the second NMOS transistor.

13. The output buffer of claim 12 further comprising:

a second input terminal, the second input terminal receiving an inverted first control signal, wherein the output terminal provides low level data in response to the inverted first control signal; and a third NMOS transistor for providing the low level data to the output terminal, wherein the third NMOS transistor is connected to the output terminal and the ground source, and wherein a gate of the third NMOS transistor is connected to the second input terminal.

14. An output buffer having an input terminal and an output terminal, comprising:

a precharge circuit connected to a power source, to a control node and to the input terminal, the precharge circuit charging the control node to a voltage potential in response to a first value of a control signal;

a first discharge circuit, connected to the control node and to a ground source, for discharging the voltage potential of the control node;

a second discharge circuit, connected to the input terminal and the control node, for discharging the voltage potential of the control node;

a PMOS output transistor connected to the power source and to the output terminal, a gate of the PMOS output transistor being connected to the control node, the PMOS output transistor generating high level data at the output terminal in response to the voltage potential of the control node, wherein the precharge circuit stops charging the control node in response to a second value of the control signal, and the first discharge circuit and the second discharge circuit both begin discharging the control node in response to the second value of the control signal, and wherein the second discharge circuit stops discharging the control node before the PMOS output transistor is substantially turned on, while the first discharge circuit continues to discharge the control node until the PMOS output transistor is substantially turned on.

15. The output buffer of claim 14, wherein the second discharge circuit comprises a detector circuit coupled to the gate of the PMOS output transistor for detecting a value of the voltage present at the gate of the PMOS output transistor and wherein the detector circuit generates a signal which stops the second discharge circuit from discharging the control node in response to the detected value of the voltage present at the gate of the PMOS output transistor.

16. The output buffer of claim 14, wherein the second discharge circuit includes a switching circuit having a threshold value approximately equal to the threshold value of the PMOS output transistor.

17. An output buffer having an input terminal and an output terminal, the input terminal receiving a control signal and the output terminal outputting low level data in response to the control signal, comprising:

a discharge circuit connected to a ground source and a control node, the discharge circuit discharging a voltage potential of the control node to a voltage potential of the ground source;

a first precharge circuit for charging the control node, the first precharge circuit connected to the control node and a power source;

a second precharge circuit for charging the control node, the second precharge circuit connected to the input terminal and the control node;

an NMOS output transistor connected between the ground source and the output terminal, a gate of the NMOS output transistor being connected to the control node, the NMOS output transistor generating the low level data in response to the voltage potential of the control node, wherein the discharge circuit stops discharging the control node in response to the control signal, the first precharge circuit and the second precharge circuit both begin charging the control node in response to the control signal, and the second precharge circuit stops charging the control node before the NMOS output transistor is substantially turned on, while the first precharge circuit continues to charge the control node until the NMOS output transistor is substantially turned on.

18. The output buffer of claim 17, wherein the second precharge circuit comprises a detector circuit coupled to the gate of the NMOS output transistor for detecting a value of the voltage present on the gate of the NMOS output transistor and wherein the detector circuit generates a signal which stops the second precharge circuit from charging the control node in response to the detected value of the voltage present on the gate of the NMOS output transistor.

19. The output buffer of claim 17, wherein the second precharge circuit includes a switching circuit having a threshold value approximately equal to the threshold value of the NMOS output transistor.

20. An output buffer having an input terminal and an output terminal, comprising:

a discharge circuit connected to a ground source, to a control node and to the input terminal, the discharge circuit discharging the control node in response to a first value of a control signal;

a first charge circuit, connected to the control node and coupled to a power source, for charging a voltage potential of the control node;

a second charge circuit, connected to the input terminal and the control node, for charging the voltage potential of the control node;

an output transistor connected to the output terminal and coupled to either the power source or to a ground source, a gate of the output transistor being connected to the control node, the output transistor generating data at the output terminal in response to the voltage potential of the control node, wherein the discharge circuit stops discharging the control node in response to a second value of the control signal, and the first charge circuit and the second charge circuit both begin charging the control node in response to the second value of the control signal, and wherein the second charge circuit stops charging the control node before the output transistor is substantially turned on, while the first precharge circuit continues to charge the control node until the output transistor is substantially turned on.

21. The output buffer of claim 20, further comprising a booster that generates a boosted voltage from a voltage output by the power source, wherein the booster provides the boosted voltage to the first charge circuit.

22. An output buffer having an input terminal and an output terminal, comprising:

a charge circuit connected to a power source, to a control node and to the input terminal, the charge circuit charging the control node in response to a first value of a control signal;

a first discharge circuit, connected to the control node and coupled to a ground source, for discharging a voltage potential of the control node;

a second discharge circuit, connected to the input terminal and the control node, for discharging the voltage potential of the control node;

an output transistor connected to the output terminal and coupled to either the power source or to a ground source, a gate of the output transistor being connected to the control node, the output transistor generating data at the output terminal in response to the voltage potential of the control node, wherein the charge circuit stops charging the control node in response to a second value of the control signal, and the first discharge circuit and the second discharge circuit both begin discharging the control node in response to the second value of the control signal, and wherein the second discharge circuit stops discharging the control node before the output transistor is substantially turned on, while the first discharge circuit continues to discharge the control node until the output transistor is substantially turned on.

23. An output buffer having an input terminal and an output terminal, the input terminal receiving a control signal, the output buffer comprising:

a discharge circuit comprising a first NMOS transistor connected between a ground source and a control node, a gate of the first NMOS transistor being connected to the input terminal, the discharge circuit discharging a voltage potential of the control node to a voltage potential of the ground source;

a first precharge circuit for charging the control node, the first precharge circuit having a first PMOS transistor connected between the control node and a power source;

a second precharge circuit for charging the control node, the second precharge circuit connected between the input terminal and the control node, the second precharge circuit including a first inverter connected between the second precharge circuit and the input terminal, a second PMOS transistor and a third PMOS transistor connected in series between the power source and the control node, wherein a gate of the second PMOS transistor is connected to the input terminal through the first inverter and a gate of the third PMOS transistor is connected to the input terminals, and a threshold voltage of the first inverter is approximately equal to the threshold voltage of the second NMOS transistor; and an output transistor comprising a second NMOS transistor connected between the ground source and the output terminal, a gate of the second NMOS transistor being connected to the control node, the second NMOS transistor generating an output signal in response to the voltage potential of the control node, wherein the discharge circuit stops discharging the control node in response to the control signal, the first precharge circuit and the second precharge circuit both begin charging the control node in response to the control signal, and the second precharge circuit stops charging the control node before the second NMOS transistor is substantially turned on, while the first precharge circuit continues to charge the control node until the second NMOS transistor is substantially turned on.

24. An output buffer having an input terminal and an output terminal, comprising:

a discharge circuit connected to a ground source, to a control node and to the input terminal, the discharge circuit discharging the control node in response to a first value of a control signal;

a first charge circuit, connected to the control node and coupled to a power source, for charging the control node to a voltage potential;

a second charge circuit, connected to the input terminal and the control node, for charging the control node to the voltage potential;

a booster that generates a boosted voltage from a voltage output by the power source, wherein the booster provides the boosted voltage to the first charge circuit;

an output transistor connected to the output terminal and coupled to either the power source or to a ground source, a gate of the output transistor being connected to the control node, the output transistor generating data at the output terminal in response to the voltage potential of the control node, wherein the discharge circuit stops discharging the control node in response to a second value of the control signal, and the first charge circuit and the second charge circuit both begin charging the control node in response to the second value of the control signal, and wherein the second charge circuit stops charging the control node before the output transistor is substantially turned on, while the first precharge circuit continues to charge the control node until the output transistor is substantially turned on.

25. An output buffer having an input terminal and an output terminal, comprising:

a precharge circuit connected to a power source, to a control node and to the input terminal, the precharge circuit charging the control node to a voltage potential in response to a first value of a control signal;

a first discharge circuit, connected to the control node and to a ground source, for discharging the voltage potential of the control node;

a second discharge circuit, connected to the input terminal and the control node, for discharging the voltage potential of the control node; and a PMOS output transistor connected to the power source and to the output terminal, a gate of the PMOS output transistor being connected to the control node, the PMOS output transistor generating high level data at the output terminal in response to the voltage potential of the control node, wherein the precharge circuit stops charging the control node in response to a second value of the control signal, and the first discharge circuit and the second discharge circuit both begin discharging the control node in response to the second value of the control signal;

the second discharge circuit stops discharging the control node before the PMOS output transistor is substantially turned on, while the first discharge circuit continues to discharge the control node until the PMOS output transistor is substantially turned on; and the second discharge circuit has a detector circuit coupled to the gate of the PMOS output transistor for detecting a value of the voltage present at the gate of the PMOS output transistor, in which the detector circuit generates a signal to stop the second discharge circuit from discharging the control node in response to the voltage present at the gate of the PMOS output transistor.

* * * * *